(12) United States Patent
Ohtou et al.

(10) Patent No.: US 11,855,090 B2
(45) Date of Patent: Dec. 26, 2023

(54) HIGH PERFORMANCE MOSFETS HAVING VARYING CHANNEL STRUCTURES

(71) Applicant: Taiwan Semiconductor Manufacturing Co., Ltd., Hsinchu (TW)

(72) Inventors: Tetsu Ohtou, Hsinchu (TW); Ching-Wei Tsai, Hsinchu (TW); Jiun-Jia Huang, Beigang Township (TW); Kuan-Lun Cheng, Hsinchu (TW); Chi-Hsing Hsu, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 123 days.

(21) Appl. No.: 17/340,217

(22) Filed: Jun. 7, 2021

(65) Prior Publication Data

US 2021/0296317 A1  Sep. 23, 2021

Related U.S. Application Data

(62) Division of application No. 16/034,520, filed on Jul. 13, 2018, now Pat. No. 11,031,395.

(51) Int. Cl.
*H01L 27/092* (2006.01)
*H01L 29/06* (2006.01)
(Continued)

(52) U.S. Cl.
CPC .... *H01L 27/0922* (2013.01); *H01L 21/02532* (2013.01); *H01L 21/02603* (2013.01);
(Continued)

(58) Field of Classification Search
CPC .......... H01L 21/02603; H01L 27/0922; H01L 29/42392
See application file for complete search history.

(56) References Cited

U.S. PATENT DOCUMENTS

| 6,232,642 B1 | 5/2001 | Yamazaki |
| 9,490,335 B1 | 11/2016 | Doris et al. |

(Continued)

FOREIGN PATENT DOCUMENTS

| CN | 104347630 A | 2/2015 |
| JP | H1117169 A | 1/1999 |

(Continued)

*Primary Examiner* — Matthew C Landau
*Assistant Examiner* — Mark Hatzilambrou
(74) *Attorney, Agent, or Firm* — Slater Matsil, LLP

(57) ABSTRACT

The present disclosure describes a method for the formation of gate-all-around nano-sheet FETs with tunable performance. The method includes disposing a first and a second vertical structure with different widths over a substrate, where the first and the second vertical structures have a top portion comprising a multilayer nano-sheet stack with alternating first and second nano-sheet layers. The method also includes disposing a sacrificial gate structure over the top portion of the first and second vertical structures; depositing an isolation layer over the first and second vertical structures so that the isolation layer surrounds a sidewall of the sacrificial gate structure; etching the sacrificial gate structure to expose each multilayer nano-sheet stack from the first and second vertical structures; removing the second nano-sheet layers from each exposed multilayer nano-sheet stack to form suspended first nano-sheet layers; forming a metal gate structure to surround the suspended first nano-sheet layers.

20 Claims, 18 Drawing Sheets

(51) Int. Cl.
- *H01L 29/423* (2006.01)
- *H01L 29/786* (2006.01)
- *H01L 29/66* (2006.01)
- *H01L 21/02* (2006.01)
- *H01L 21/8238* (2006.01)

(52) U.S. Cl.
CPC ........ *H01L 21/823807* (2013.01); *H01L 21/823814* (2013.01); *H01L 21/823828* (2013.01); *H01L 29/0649* (2013.01); *H01L 29/0673* (2013.01); *H01L 29/42392* (2013.01); *H01L 29/66545* (2013.01); *H01L 29/66742* (2013.01); *H01L 29/78618* (2013.01); *H01L 29/78651* (2013.01); *H01L 29/78684* (2013.01); *H01L 29/78696* (2013.01)

(56) References Cited

U.S. PATENT DOCUMENTS

| | | |
|---|---|---|
| 9,653,480 B1 | 5/2017 | Cheng et al. |
| 9,991,254 B1 | 6/2018 | Cheng et al. |
| 10,014,219 B2 | 7/2018 | Sun et al. |
| 10,014,390 B1 | 7/2018 | Bouche et al. |
| 2013/0341704 A1 | 12/2013 | Rachmady et al. |
| 2014/0097502 A1 | 4/2014 | Sun et al. |
| 2015/0048455 A1 | 2/2015 | Basker et al. |
| 2015/0370949 A1 | 12/2015 | Moroz et al. |
| 2016/0104765 A1 | 4/2016 | Ching et al. |
| 2017/0025314 A1* | 1/2017 | Witters ............... H01L 21/3065 |
| 2017/0104061 A1 | 4/2017 | Peng et al. |
| 2017/0148890 A1 | 5/2017 | Ando et al. |
| 2017/0162442 A1 | 6/2017 | Sun et al. |
| 2017/0287788 A1 | 10/2017 | Doris et al. |
| 2018/0083046 A1 | 3/2018 | Cheng et al. |
| 2018/0151677 A1 | 5/2018 | Glass et al. |
| 2019/0131394 A1 | 5/2019 | Reznicek et al. |
| 2020/0006478 A1 | 1/2020 | Hsu et al. |

FOREIGN PATENT DOCUMENTS

| | | |
|---|---|---|
| KR | 20170041605 A | 4/2017 |
| TW | 201814905 A | 4/2018 |
| WO | 2018063300 A1 | 4/2018 |

* cited by examiner

HIGH PERFORMANCE MOSFETS HAVING VARYING CHANNEL STRUCTURES

PRIORITY CLAIM AND CROSS-REFERENCE

This application is a divisional of U.S. application Ser. No. 16/034,520, filed on Jul. 13, 2018, entitled "High Performance MOSFET" which is hereby incorporated herein by reference.

BACKGROUND

Integrated circuits (ICs) used in mobile applications (e.g., mobile computing, smart phones, tablets, smart gear, etc.) can have stringent power and performance requirements. For example, p-type and n-type field-effect transistors (FETs) are expected to exhibit a balanced switching performance (e.g., similar turn ON and OFF characteristics) within the logic and static access memory (SRAM) regions of the chip. However, due to FET scaling, p-type and n-type FETs may develop a performance mismatch. For example, NFETs can become "faster" than PFETs due to different materials used in their respective fabrication, different lattice orientations, or different strain engineering conditions applied to the their respective channel region.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

Figure 1:
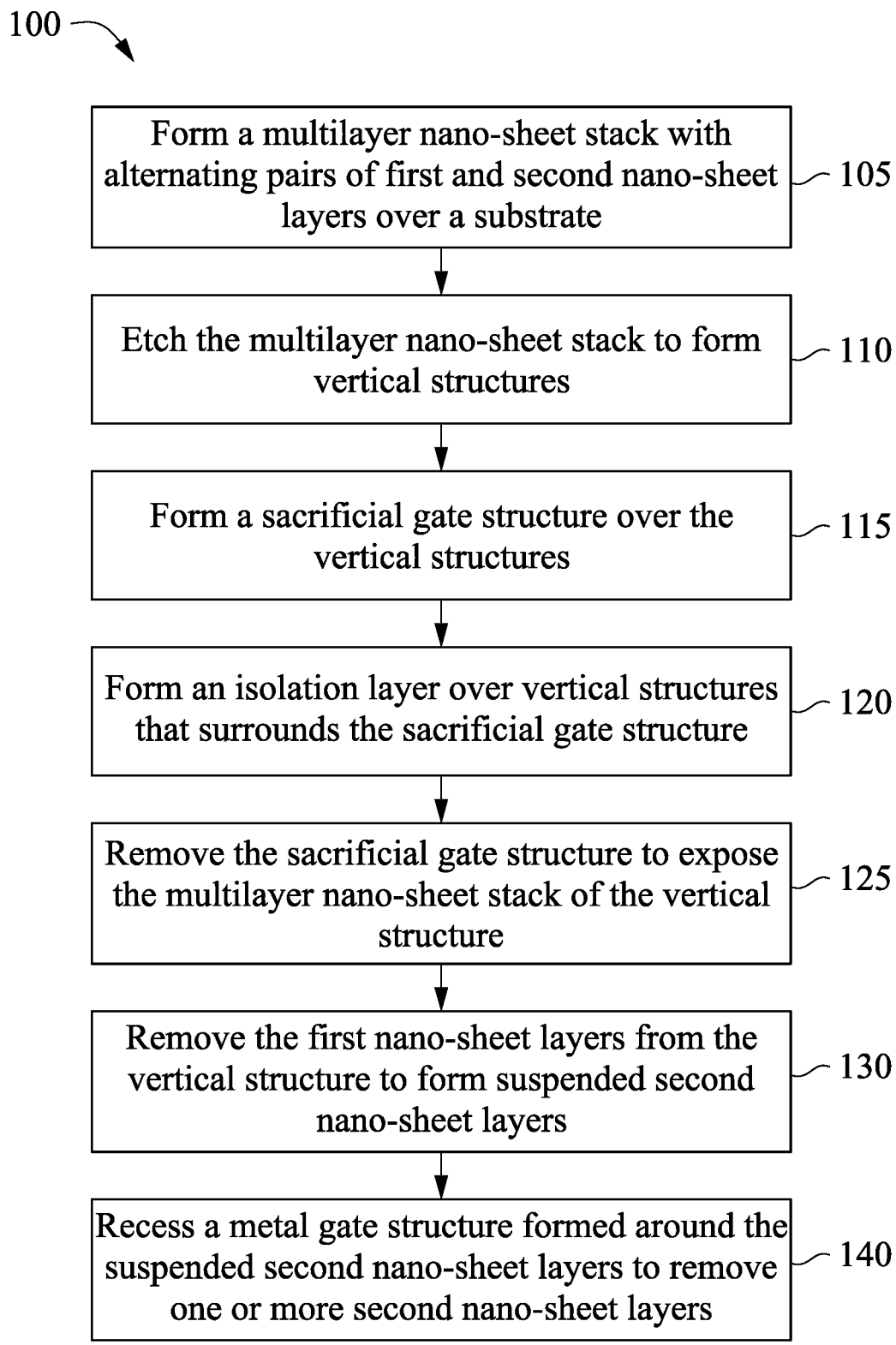
FIG. 1 is a flow diagram of a method for fabricating a gate-all-around nano-sheet FET, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The term "substantially" as used herein indicates the value of a given quantity that can vary based on a particular technology node associated with the subject semiconductor device. Based on the particular technology node, the term "substantially" can indicate a value of a given quantity that varies within, for example, ±5% of the value.

The term "about" as used herein indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

The term "vertical," as used herein, means nominally perpendicular to the surface of a substrate.

The term "insulating layer", as used herein, refers to a layer that functions as an electrical insulator (e.g., a dielectric layer).

Integrated circuits (ICs) used in mobile applications (e.g., mobile computing, smart phones, tablets, smart gear, etc.) can have stringent power and performance requirements. For example, p-type and n-type field-effect transistors (FETs) are expected to exhibit a balanced switching performance (e.g., turn ON and OFF characteristics) within the logic and static access memory (SRAM) regions of the chip. However, due to FET scaling, p-type FETs (PFETs) and n-type FETs (NFETs) may develop a performance mismatch. For example, NFETs can become "weaker" than PFETs due to (i) different materials used in their respective fabrication process, (ii) different lattice orientations, (iii) different strain engineering conditions applied to the FETs' channel region, or a combination thereof. Additionally, double-gate or tri-gate finFETs may suffer from short channel effects when the gate electrode loses control of the channel region. For example, aggressively scaling in double-gate or tri-gate finFETs may result in drain induced barrier lowering (DIBL)—e.g., loss of gate control over the channel due to the drain voltage.

The embodiments described herein are directed to a fabrication method and structures that provide different types of gate-all-around (GAA) nano-sheet FETs with tunable/adjustable performance. For example, both n-type and p-type tunable GAA nano-sheet FETs—also referred to herein as "NSFs"—can originate from multilayer nano-sheet stacks with alternating pairs of first and second nano-sheet layers. By way of example and not limitation, the first and second nano-sheet layers, in the multilayer nano-sheet stacks, can include epitaxially grown silicon-germanium (SiGe) and silicon (Si) nano-sheet layers, respectively. In some embodiments, the n-type NSF feature a channel region with Si nano-sheet layers, and the p-type NSF feature a channel region with SiGe nano-sheet layers. In each NSF, the dimensions and the number of the nano-sheet layers can be controlled during the early stages of the NSF's fabrication process to produce different types of GAA nano-sheet FETs. Further, the dimensions and the number of the nano-sheet layers can be used to tailor the electrical performance of the resulting GAA nano-sheet FETs. For example, the resulting nano-sheet GAA FETs can exhibit improved gate control (e.g., low DIBL), and adjustable drive current and power consumption. Further, by using the embodiments described herein, hybrid devices with finFETs and different type of GAA nano-sheet FETs can be formed on the same substrate.

FIG. 1 is a flow chart of fabrication method 100 according to some embodiments. Fabrication method 100 describes the formation of GAA nano-sheet FETs according to some embodiments. Other fabrication operations may be performed between the various operations of method 100 and may be omitted merely for clarity. This disclosure is not limited to this operational description. Rather, other operations are within the spirit and scope of the present disclosure. It is to be appreciated that additional operations may be performed. Moreover, not all operations may be needed to perform the disclosure provided herein. Additionally, some of the operations may be performed simultaneously, or in a different order than shown in FIG. 1. In some embodiments, one or more other operations may be performed in addition to or in place of the presently described operations. For illustrative purposes, fabrication method 100 is described with reference to the embodiments shown in FIGS. 2 through 18.

Figure 2:
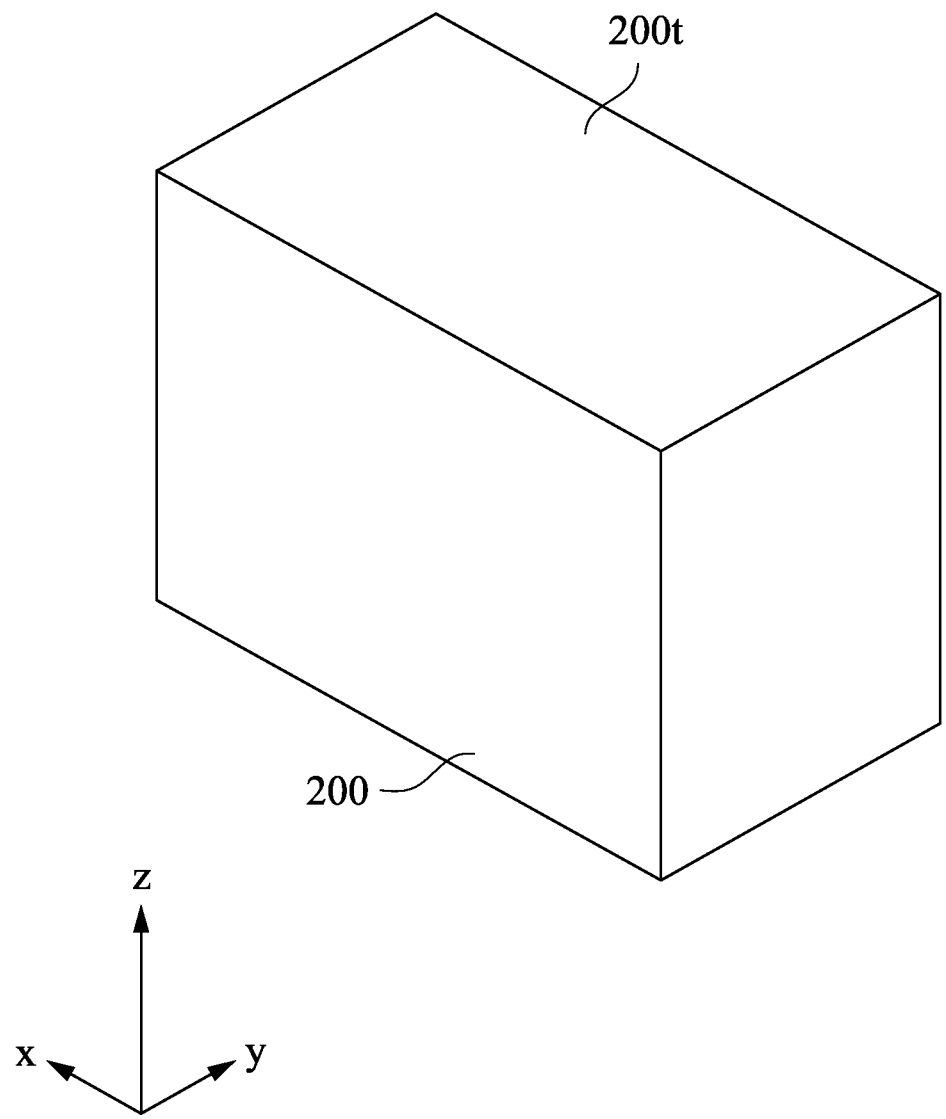
FIGS. 2-13 are isometric views of a gate-all-around nano-sheet FET structure at different fabrication stages, in accordance with some embodiments.

Method 100 begins with operation 105 and the formation of a multilayer nano-sheet stack over a substrate. According to some embodiments, the multilayer nano-sheet stack includes alternating pairs of first and second nano-sheet layers grown vertically on top of each other. FIGS. 2 through 8 are isometric views of partially fabricated structures that can be used to describe the fabrication stages of operation 105. For example, FIG. 2 is an isometric view of a portion of substrate 200, according to some embodiments. By way of example and not limitation, substrate 200 can be a bulk semiconductor wafer or the top semiconductor layer of a semiconductor-on-insulator (SOI) wafer (not shown) such as, for example, silicon-on-insulator. Further, substrate 200 can include crystalline silicon with its top surface 200t parallel to the (100) crystal plane (e.g., x-y plane). In some embodiments, substrate 200 can include another elementary semiconductor such as, for example, (i) germanium (Ge); (ii) a compound semiconductor including silicon carbide (SiC), gallium arsenide (GaAs), gallium phosphide (GaP), indium phosphide (InP), indium arsenide (InAs), and/or indium antimonide (InSb); (iii) an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP); or (iv) combinations thereof.

For example purposes, substrate 200 in method 100 will be described in the context of crystalline silicon with its top surface 200t parallel to the (100) crystal plane. Based on the disclosure herein, other materials, as discussed above, can be used. These materials are within the spirit and scope of this disclosure.

Figure 3:
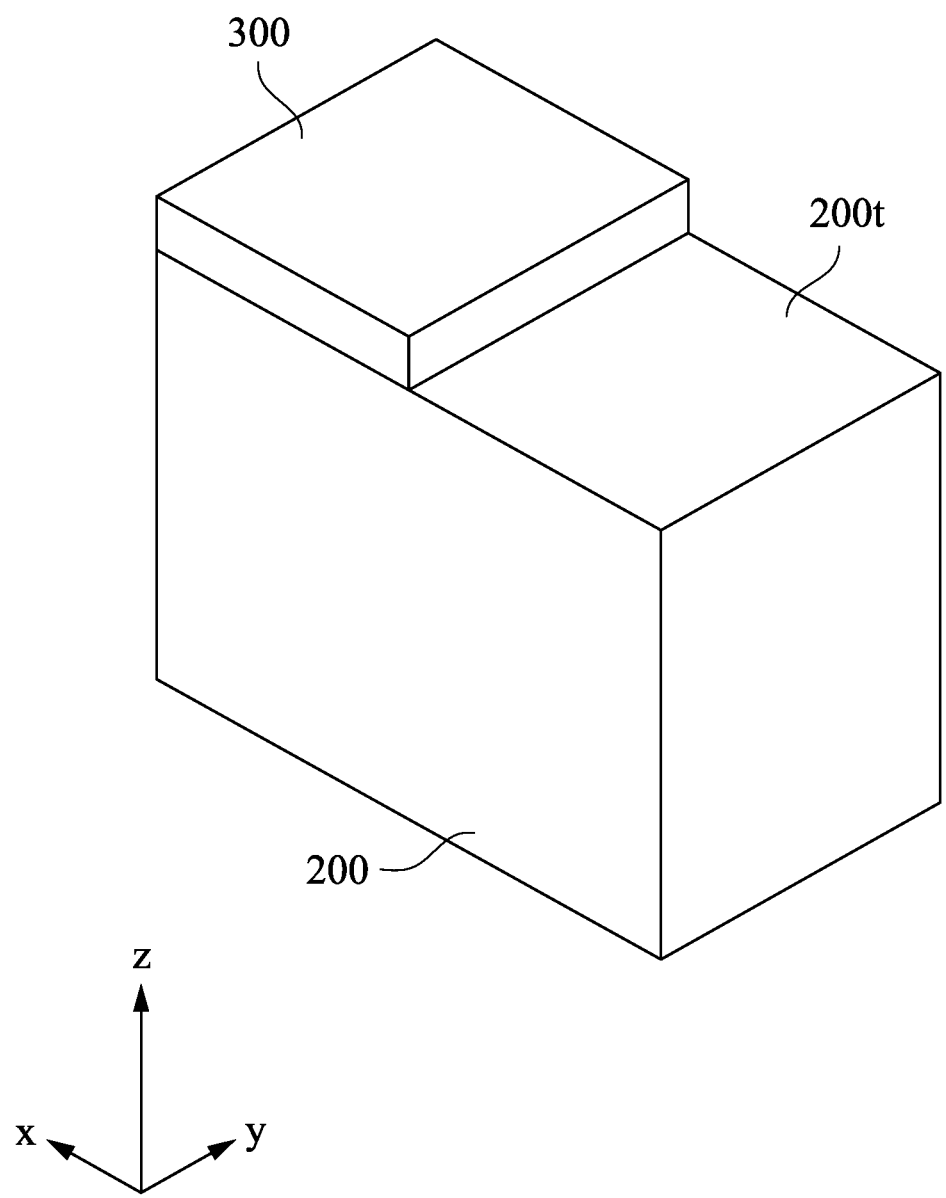
Figure 4:
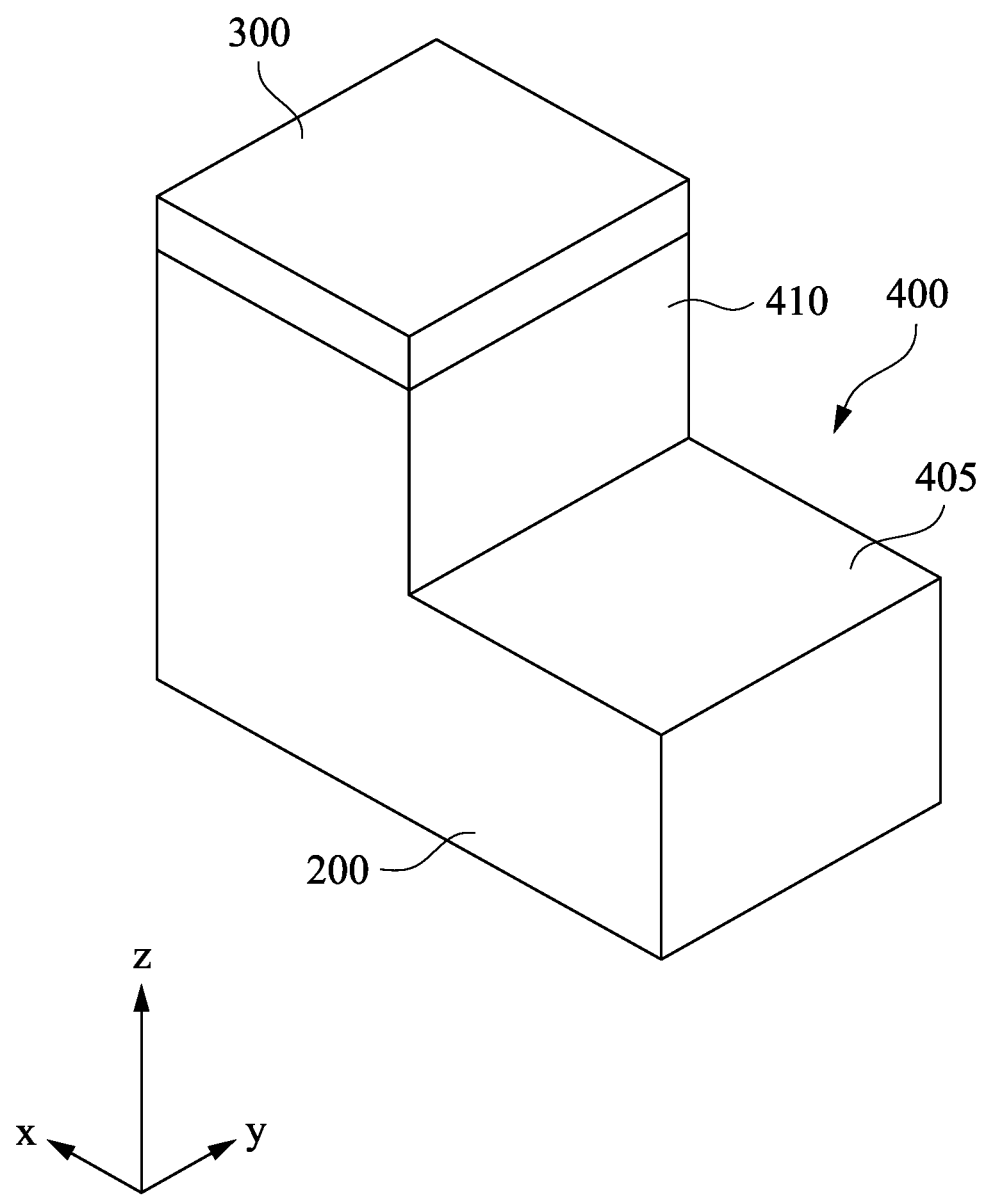

In some embodiments, the multilayer nano-sheet stack fabrication starts with the deposition and patterning of a hard mask layer 300 over substrate 200, as shown in FIG. 3. As a result, selected areas of substrate 200 can be exposed, such as top surface 200t of substrate 200 shown in FIG. 3. As discussed above, top surface 200t of substrate 200 is parallel to the (100) crystal plane (e.g., x-y plane). By way of example and not limitation, hard mask layer 300 can include silicon nitride ($Si_3N_4$, thereafter "SiN"), silicon carbon nitride (SiCN), silicon oxide ($SiO_2$), any other suitable material, or any combination thereof. Hard mask layer 300 can be patterned so that top surface 200t of substrate 200 can be exposed in multiple locations. A subsequent anisotropic dry etching process can etch the exposed substrate 200 to form one or more recess region 400 as shown in FIG. 4. The depth (e.g., in the z-direction) of recess region 400 can be controlled with the dry etching process. In some embodiments, more than one recess region, similar to recess region 400, can be formed in substrate 200 according the patterning design of hard mask layer 300. Recess region 400 has a bottom horizontal surface 405 and one or more vertical surfaces 410 (e.g., vertical sidewalls). According to some embodiments, horizontal surface 405 is parallel to the (100) crystal plane (e.g., x-y plane) and vertical surfaces 410 are parallel to the (110) crystal plane (e.g., y-z plane). By way of example and not limitation, the area of recess region 400 (e.g., area of horizontal surface 405) can be about 500×0.1 $\mu m^2$ (e.g., x-direction and y-direction, respectively), with a depth in vertical z-direction between about 100 nm and about 200 nm. However, the aforementioned dimensions are not limiting and recess region 400 can be smaller or larger than the above-mentioned dimensions.

Next, alternating pairs of first and second nano-sheet layers can be grown in recess region 400 to form a multilayer nano-sheet stack that will fill recess region 400. In some embodiments, the first and second nano-sheet layers can be epitaxially grown in recess region 400 using the exposed horizontal surfaces 405 (e.g., x-y plane) as a seed surface. As discussed above, exposed horizontal surfaces 405 are parallel to the top surface of substrate 200 and therefore share the same crystallographic orientation (e.g., parallel to the (100) crystal plane, x-y plane). Consequently, the epitaxial layers that are formed on exposed horizontal surfaces 405 will have the same crystallographic orientation as if they were grown on top surface 200t (shown in FIG. 2) of substrate 200. Nano-sheet layers may not grow on areas of substrate 200 that are covered with hard mask layer 300. Therefore, in some embodiments, the growth of nano-sheet layers is confined to the exposed surfaces of recess regions 400. In some embodiments, vertical surfaces 410 of recess region 400 can be covered with a hard mask layer to prevent nano-sheet layer growth. In some embodiments, the epitaxial growth of nano-sheet layers is favorable on the (100) crystal plane (e.g., on exposed horizontal surface 405) as opposed to the (110) crystal plane (e.g., vertical surfaces 410).

In some embodiments, the first and second nano-sheet layers include SiGe and Si, respectively. Alternatively, first nano-sheet layers can include III-V compound semiconductors, such as GaAs, InP, GaP, GaN, etc. For example purposes, the nano-sheet multilayer stack in method 100 will be described in the context of alternating SiGe and Si nano-sheet epitaxial layers. Based on the disclosure herein, other materials, as discussed above, can be used. These materials are within the spirit and scope of this disclosure.

Figure 5:
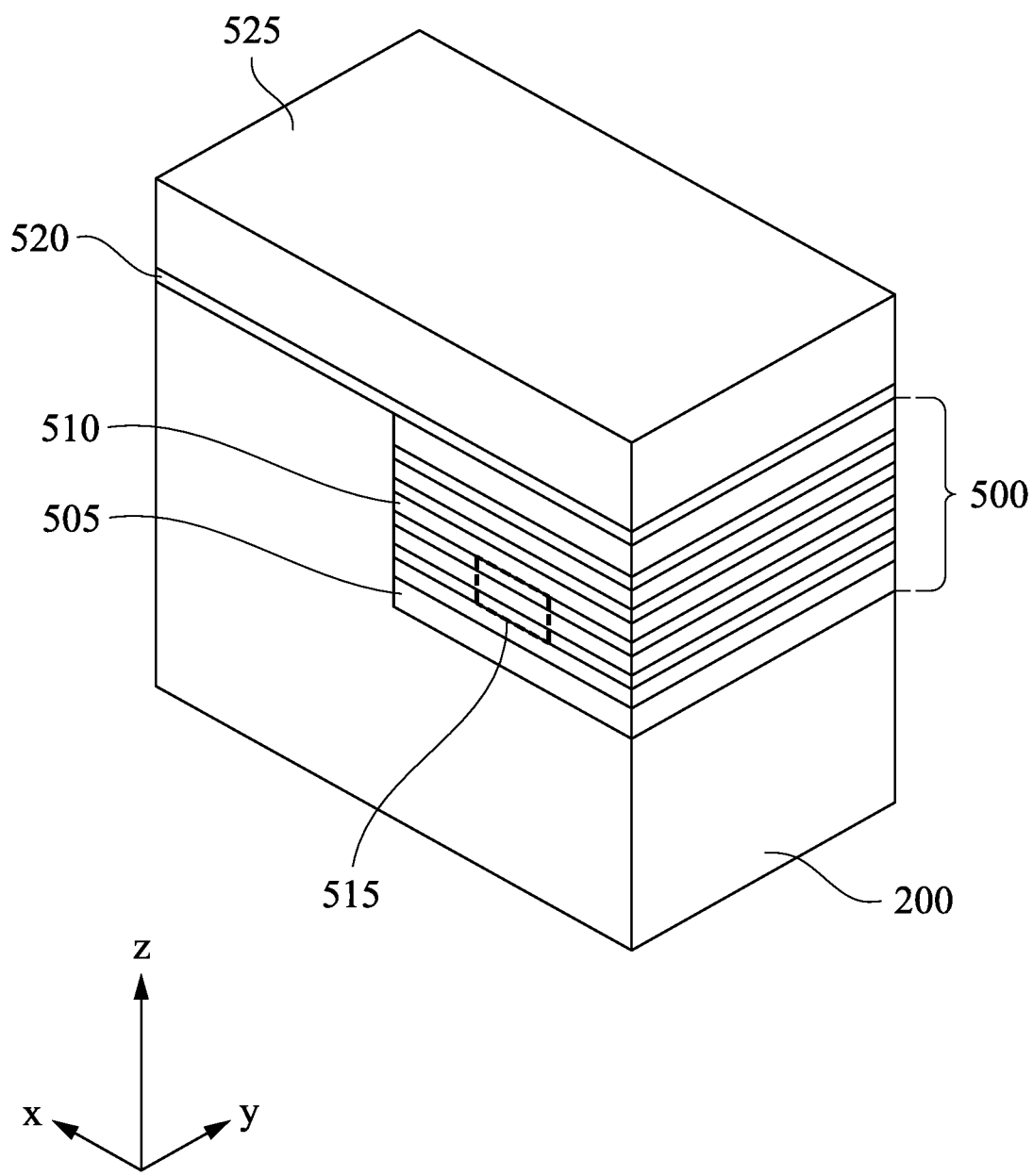

By way of example and not limitation, precursor gases that can be used for the growth of the SiGe and Si nano-sheet layers include silane ($SiH_4$), disilane ($Si_2H_6$), germane ($GeH_4$), digermane ($Ge_2H_6$), dichlorosilane ($SiH_2Cl_2$), any other suitable gas, or combinations thereof. According to some embodiments, FIG. 5 is an isometric view of substrate 200 after the formation of multilayer nano-sheet stack 500 in recess region 400. By way of example and not limitation, multilayer nano-sheet stack 500 can include alternating pairs of a SiGe nano-sheet layer 505 (bottom layer) and a Si nano-sheet layer 510 (upper layer). SiGe nano-sheet layers 505 may contain from about 10% to about 50% Ge (e.g., 15%, 20%, 30%, 40%, etc.). The presence of Ge in SiGe nano-sheet layers increases the intrinsic stress in the SiGe nano-sheet layers and improves the hole mobility for p-type NSF. Ge concentrations below 10% can provide limited hole mobility benefit, and Ge concentration higher than 50% can lead to stacking faults and defects in the SiGe nano-sheet layers. Defects in SiGe nano-sheet stacks can be detrimental to p-type NSF performance because they can increase the channel resistance. In some embodiments, the top layer of the multilayer nano-sheet stack is a Si nano-sheet layer 510 and the bottom layer is a SiGe nano-sheet layer 505, as shown in FIG. 5.

In some embodiments, the thickness of Si nano-sheet layers 510 can control the pitch (or spacing) between every other SiGe nano-sheet layer 505, and similarly the thickness of SiGe nano-sheet layers 505 can control the pitch (or spacing) between every other Si nano-sheet layer 510. For example, referring to FIG. 6, which is a magnified view of section 515 in FIG. 5, thickness 510$t$ of Si nano-sheet layer 510 can be used to define pitch 505$p$ for SiGe nano-sheet layers 505. It is at this fabrication stage where the pitch of similar type nano-sheet layers is defined. Further, each of the nano-sheet layers (e.g., SiGe or Si) can have the same or different thicknesses. In some embodiments, the thickness of each SiGe nano-sheet layer 505 and Si nano-sheet layers 510 can range from about 5 nm to about 20 nm (e.g., from 5 nm to 10 nm, from 10 nm to 15 nm, form 5 nm to 15 nm, from 10 nm to 20 nm, etc.). Since the SiGe and Si nano-sheet layers are grown individually, the SiGe nano-sheet layers 505 and the Si nano-sheet layers 510 can have the same or different thickness from each other. Further, the SiGe nano-sheet layers can have the same or different thickness from each other, and similarly the Si nano-sheet layers can have the same or different thickness from each other.

In some embodiments, multilayer nano-sheet stack 500 can include up to about 10 to 12 total nano-sheet layers (e.g., about 5 to 6 pairs of SiGe/Si nano-sheet layers). However, additional or fewer nano-sheet layers are possible depending on the design of the resulting NSF. In some embodiments, the depth of recess region 400 shown in FIG. 4 can be adjusted to accommodate larger or fewer numbers of SiGe and Si nano-sheet layers. In some embodiments, the height (in the vertical z-direction) of multilayer nano-sheet stack 500 can range between about 100 nm and about 200 nm (e.g., between 100 nm and 150 nm, 140 nm and 180 nm, 160 nm and 200 nm, etc.). Further, the height of multilayer nano-sheet stack 500 can be equal to the depth of recess region 400 so that the top surface of multilayer nano-sheet stack 500 is substantially co-planar with a top surface of the un-recessed areas of substrate 200. However, this is not a limitation and shorter or taller multilayer nano-sheet stacks 500 are possible. Further, the aforementioned thicknesses for each nano-sheet layer and multilayer nano-sheet stack are not limiting.

After the formation of multilayer nano-sheet stack 500, hard mask layer 300 (not shown in FIG. 5) is removed (e.g., stripped with a wet clean). An oxide 520 and a capping layer 525 can be subsequently grown over the un-recessed areas of substrate 200 and multilayer nano-sheet stack 500, as shown in FIG. 5. In some embodiments, oxide 520 includes a $SiO_2$ layer and capping layer 525 includes a nitride layer, such as SiN.

Figure 7:
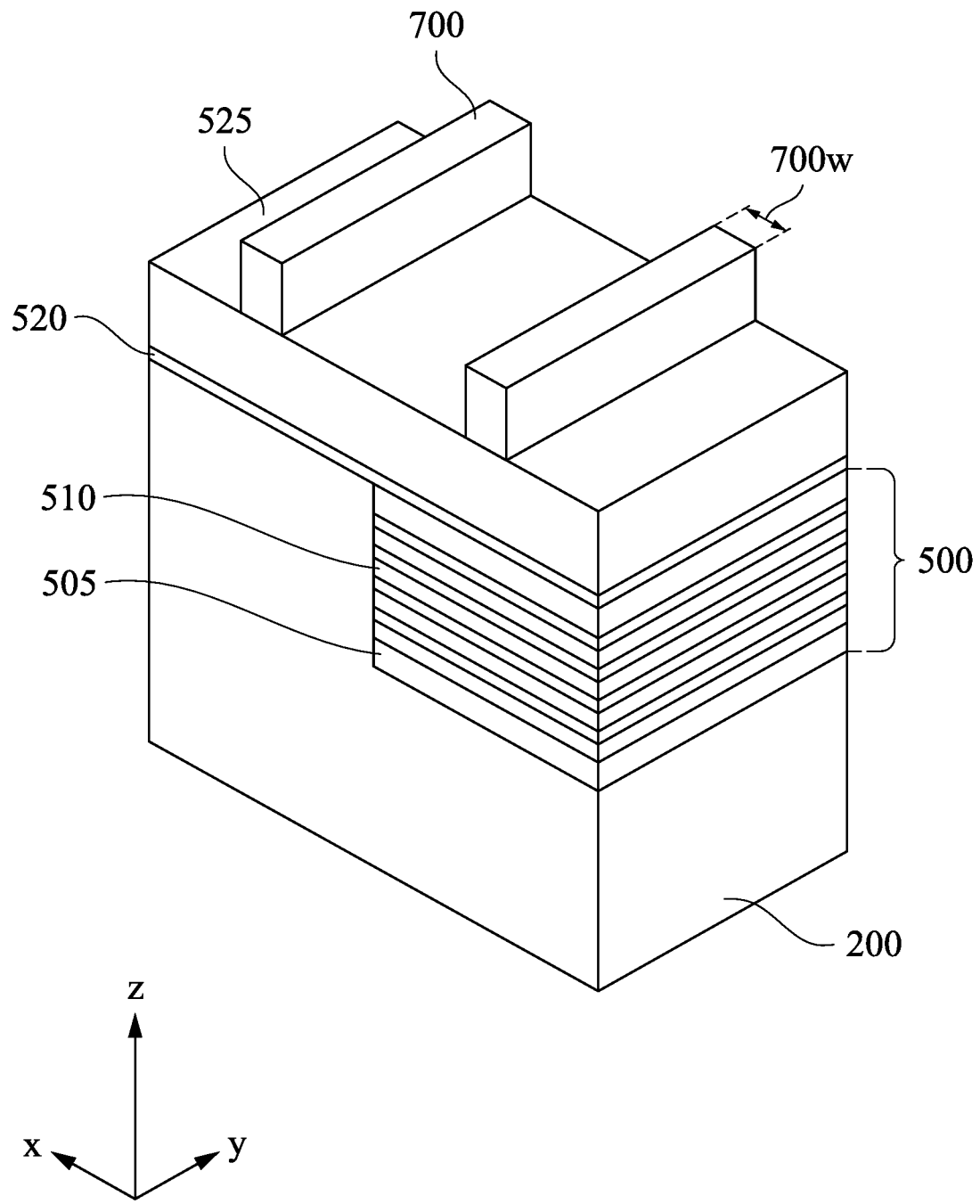

In referring to FIG. 1, method 100 continues with operation 110 and the formation of vertical structures by etching selective portions of the multilayer nano-sheet stack 500 shown in FIG. 5. For example, in referring to FIG. 7, a photoresist layer can be spin-coated over capping layer 525 and subsequently patterned to form patterned photoresist structures 700. In some embodiments, photoresist structures 700 are oriented along the y-axis or the <110> direction, as shown in FIG. 7. Patterned photoresist structures 700 can be used as an etch mask in a subsequent etching process. During the etching process, portions of multilayer nano-sheet stack 500, which are not masked by the patterned photoresist structures 700, will be removed to form vertical structures with multilayer nano-sheet stacks that are oriented along the y-axis or the <110> direction. In some embodiments, the orientation of the vertical structures in the <110> direction is intentional, so that the channel regions of the resulting nano-sheet FETs are formed along the <110> direction. This means that the current flow of the resulting NSF will be along the <110> direction. Current direction along the <110> direction is beneficial for the electron mobility in the NFETs.

Similarly, photoresist structures 700 over substrate 200 can be used for the formation of fins made from the substrate material. The single-material fins (thereafter "fins") can be used to form double gate or tri-gate finFETs on substrate 200.

Accordingly, width 700$w$ of the patterned photoresist structures 700 can define the width of the vertical structures, which subsequently define the width of the channel region in the nano-sheet FETs. According to some embodiments, the width of the channel region in a FET can determine the amount of current that flows through the channel region. For example, a wide channel region can carry a higher current density than a narrow channel region. However, a narrow channel region may provide better gate control than a wider channel region. Therefore, the width of each vertical structure with a multilayer nano-sheet stack can be adjusted to offer a balance between current density and gate control over the channel region. Further, by controlling the width 700$w$ of each pattern photoresist structure 700, vertical structures with different widths can be formed over substrate 200. In other words, nano-sheet FETs can be built with different nano-sheet layer widths at any desired location on the substrate.

Figure 8:
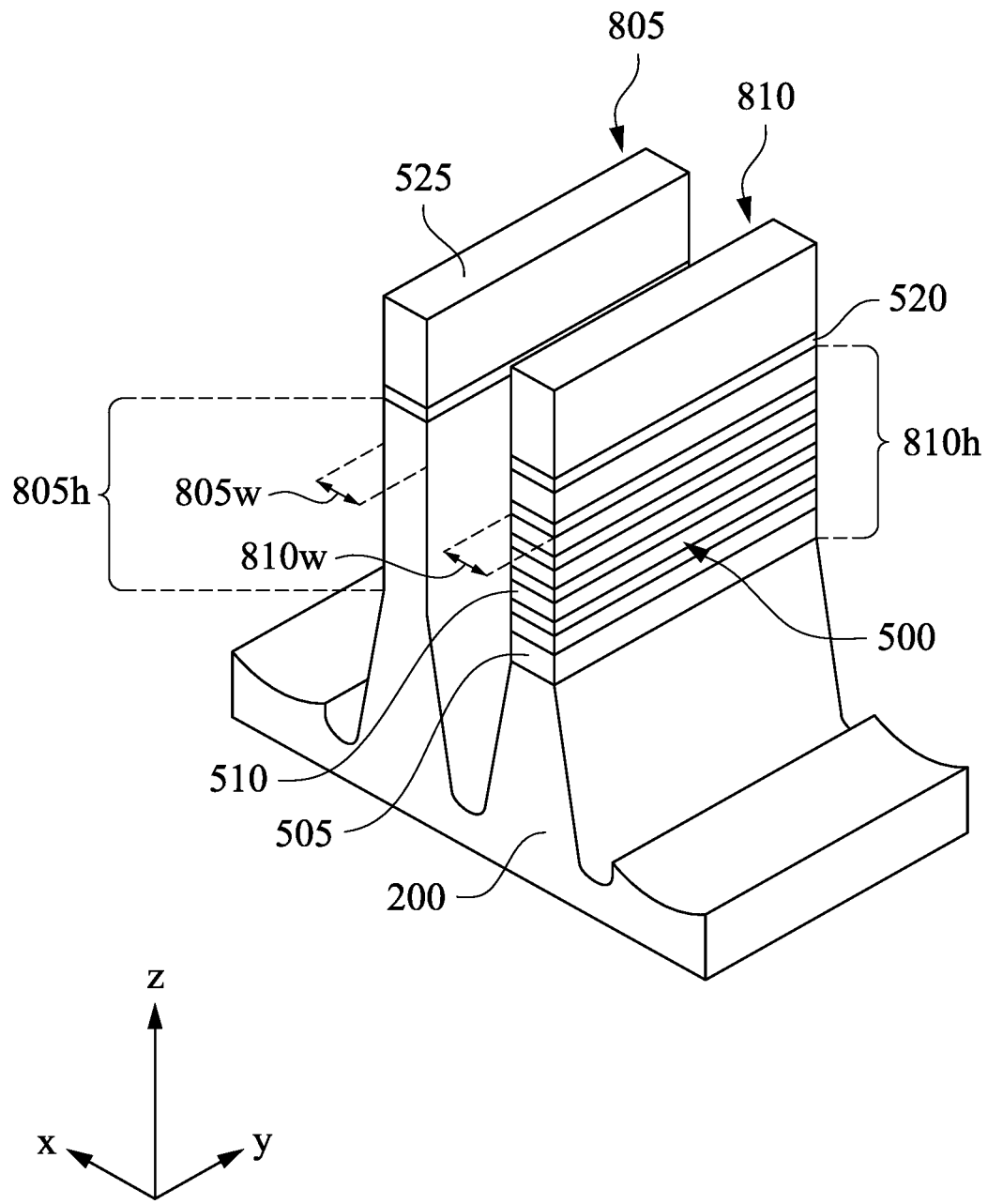

FIG. 8 shows the resulting structures after the etching process described above; e.g., fin 805 and vertical structure 810 with multilayer nano-sheet stack 500. As discussed above, fin 805 is made of substrate material—for example, Si or another elementary semiconductor, such as (i) Ge; (ii) a compound semiconductor including silicon carbide, GaAs, GaP, InP, InAs, and/or InSb; (iii) an alloy semiconductor including SiGe, GaAsP, AlInAs, AlGaAs, GaInAs, GaInP, and/or GaInAsP; or (iv) combinations thereof.

In some embodiments, width 805$w$ of fin 805 ranges from about 4 nm to about 15 nm (e.g., from 4 nm to 10 nm, 8 nm to 12 nm, 10 nm to 15 nm, etc.) and width 810w of vertical structure 810 with multilayer nano-sheet stack 500 ranges from about 4 nm to about 50 nm (e.g., from 4 nm to 10 nm, 8 nm to 15 nm, 10 nm to 25 nm, 15 nm to 30 nm, 20 nm to 50 nm, etc.). Consequently, vertical structure 810 with multilayer nano-sheet stack 500 can be formed to be wider than fin 805.

The configuration of FIG. 8 is referred to herein as a "hybrid" configuration, where vertical structures with multilayer nano-sheet stacks are concurrently formed with fins on substrate 200. According to some embodiments, nano-sheet FETs will be formed on multilayer nano-sheet vertical structure 810, and finFETs will be formed on fins 805. As discussed above, different arrangements of fins 805 and vertical structures 810 on substrate 200 are possible; for example, an array of multilayer nano-sheet vertical structures 805, an array of Si fins 805, or combinations thereof. Consequently, combinations of nano-sheet FETs and finFETs are possible across substrate 200.

Further, multilayer nano-sheet vertical structures 810 can be formed with different widths 810w. Therefore, the formation of nano-sheet FETs with a range of nano-sheet widths (e.g., channel widths) is possible on substrate 200.

In some embodiments, height 805h of fin 805 is equal to, or different than, height 810h of vertical structure 810. For example 805h can be taller or shorter than 810h. In some embodiments, 810h can range from about 100 nm to about 200 nm (e.g., 100 nm to 150 nm, 140 nm to 180 nm, 160 nm to 200 nm, etc.).

Referring to FIG. 1, method 100 continues with operation 115 and the formation of a sacrificial gate structure over vertical structures 810 with multilayer nano-sheet stack 500. In some embodiments, sacrificial gate structures, according to operation 115, can also be formed concurrently on fins 805. For example purposes, operation 115 will be described for sacrificial gate structures formed on vertical structures 810 with multilayer nano-sheet stacks 500. Based on the disclosure herein, operation 115 can be used to form sacrificial gate structures on fins 805 and vertical structures 810 with multilayer nano-sheet stacks 500, as discussed above.

Figure 9:
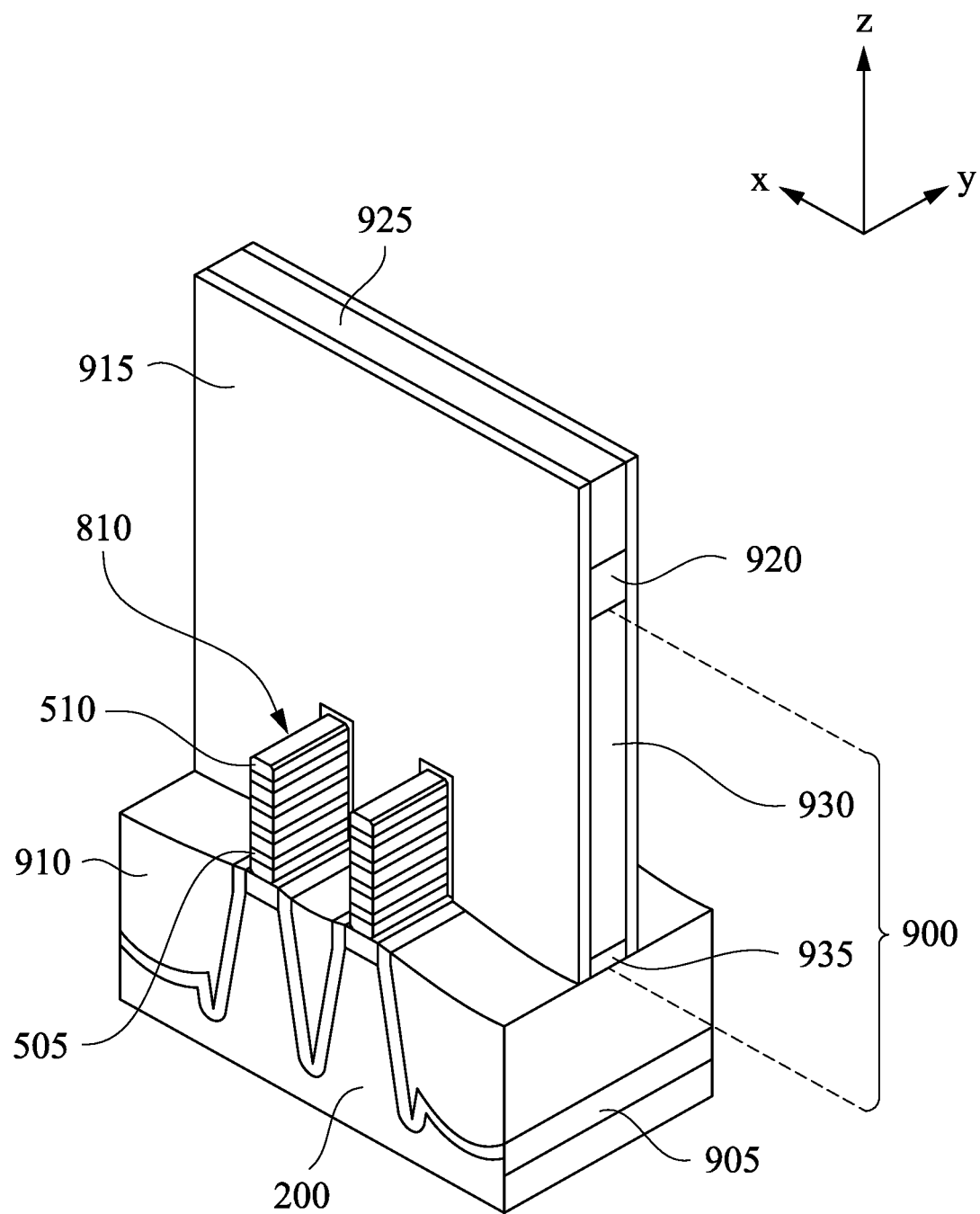

FIG. 9 is an isometric view of a sacrificial gate structure 900 formed over two vertical structures 810, each with a multilayer nano-sheet stack therein. Sacrificial gate structure 900 is formed along the x-axis (e.g., perpendicular to the length of vertical structures 810). In some embodiments, FIG. 9 is at a later "fabrication stage" compared to FIG. 8, and therefore FIG. 9 includes additional structural elements such as liner 905, insulating layer 910, gate spacers 915, capping layer 920 and oxide layer 925.

In some embodiments, sacrificial gate structure 900 includes a sacrificial gate electrode 930 and a sacrificial gate dielectric 935. By way of example and not limitation, sacrificial gate dielectric 935 is deposited prior to sacrificial gate electrode 930 and is interposed between vertical structures 810 and sacrificial gate electrode 930. According to some embodiments, sacrificial gate dielectric 935 includes $SiO_2$ or silicon-oxynitride (SiON), and can be replaced with a high-dielectric constant (high-k) dielectric in a subsequent gate structure replacement operation. Further, sacrificial gate electrode 930 can include polycrystalline silicon (polysilicon) and can be replaced with a metal gate electrode stack in a subsequent gate structure replacement operation. By way of example and not limitation, sacrificial gate dielectric 935 and sacrificial gate electrode 930 can be deposited as blanket layers and patterned with photolithography and etching operations to form sacrificial gate structure 900 over multilayer vertical structures 810 and insulating layer 910.

It is noted that additional sacrificial gate structures (e.g., like sacrificial gate structure 900) can be formed parallel to sacrificial gate structure 900 and perpendicular to a projection of vertical structures 810 along the y-axis. Therefore, FIG. 9 can include additional sacrificial gate structures 900 parallel to each other and on vertical structures 810.

In some embodiments, insulating layer 910 can be an isolation structure, such as a shallow trench isolation (STI) that includes $SiO_2$, SiN, SiON, fluorine-doped silicate glass (FSG), a low-k dielectric material (e.g., with k-value less than about 3.9), and/or other suitable dielectric material with appropriate fill properties. Liner 905 can be a nitride, such as SiN.

Gate spacers 915 (or spacers 915) can function as alignment masks in an ion implantation operation for the formation of the source/drain junctions on vertical structures 810. By way of example and not limitation, spacers 915 can be deposited as a blanket film which can be etched with an etchback process to form spacers 915 on the sidewalls of sacrificial gate structure 900. In some embodiments, the etchback process is an anisotropic etch that removes the spacer material faster on horizontal surfaces (e.g., on the x-y plane) compared to vertical surfaces (e.g., on the y-z or x-z planes). Since the spacer material is blanket deposited, it can cover the exposed surfaces vertical structures 810. A sidewall pull back process can remove the spacer material from the vertical structure's sidewall surfaces.

In some embodiments, spacers 915 can include a dielectric material, such as $SiO_2$, SiON, SiCN, silicon oxy-carbide (SiOC), or SiN. In some embodiments, the thickness of spacers 915 can range from about 2 nm to about 5 nm. Spacers 915 can be a stack of one or more layers that include the same or different materials. According to some embodiments, spacers 915 are not removed during the metal gate replacement process and can function as structural elements for the metal gate structure that will replace sacrificial gate structure 900.

Figure 10:
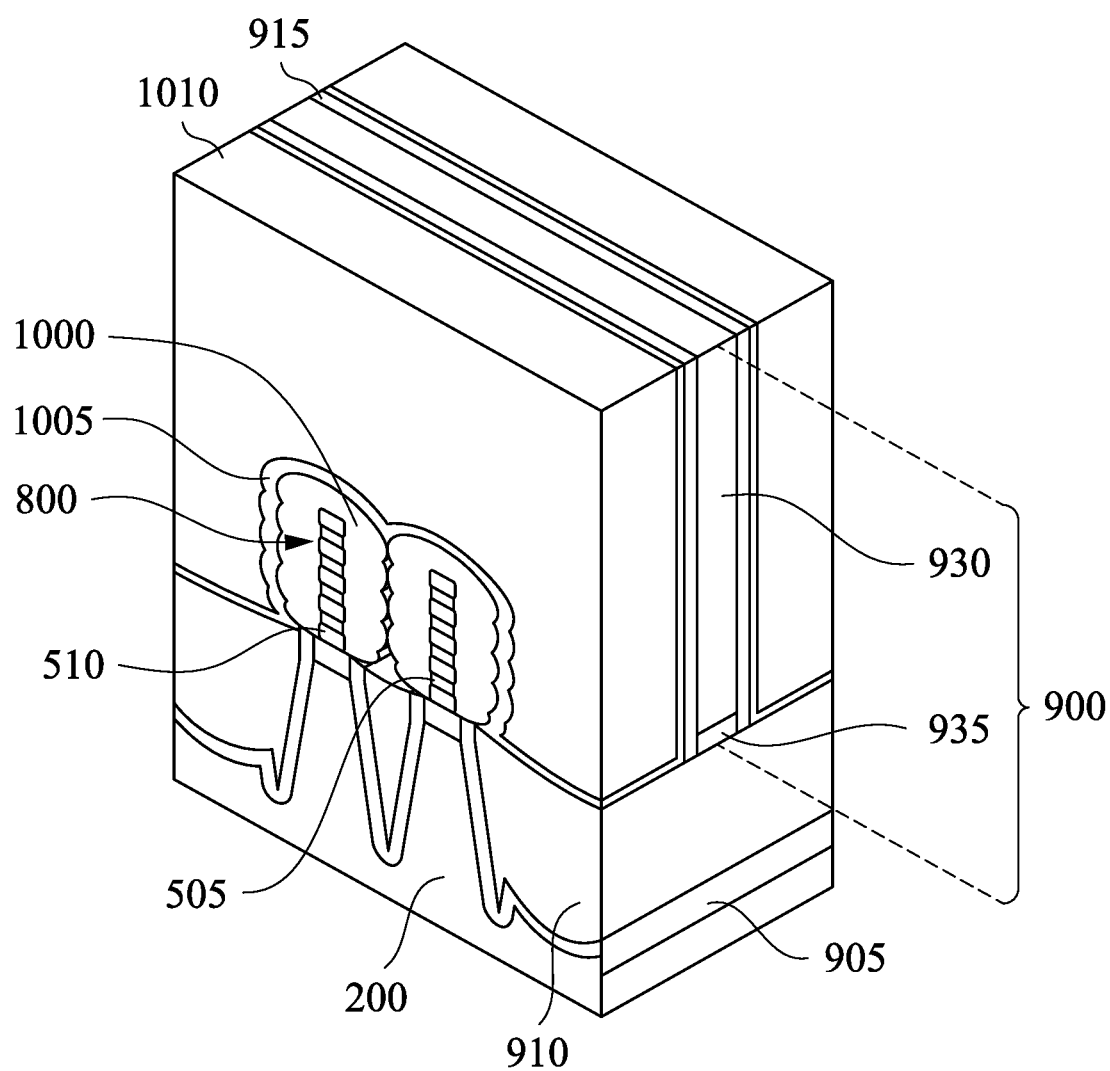

In referring to FIG. 10 a source/drain (S/D) epitaxial stack 1000 can be grown on each of vertical structures 810 and adjacent to sacrificial gate structure 900. In some embodiments, epitaxial stacks 1000 can be boron-doped SiGe stacks suitable for p-type NSF, or phosphorous-doped Si layers suitable for n-type NSF. For example purposes, epitaxial stacks 1000 will be described in the context of phosphorous (P)-doped Si layers for n-type NSF. Based on the disclosure herein, boron (B)-doped silicon (SiGe) stacks for p-type NSF can also be grown. These S/D epitaxial stacks are within the spirit and scope of this disclosure. Further, since n-type and p-type NSF can be formed on a single substrate, B-doped SiGe stacks and P-doped Si layers can be grown on desired vertical structures 810 across substrate 200.

In some embodiments, P-doped (n-type) Si S/D layers can be epitaxially grown using silane ($SiH_4$) precursor. A phosphorous dopant can be introduced into the Si epitaxially grown layer during growth. In some embodiments, the phosphorous concentration can range from about $10^{21}$ atoms/cm$^3$ to about $8 \times 10^{21}$ atoms/cm$^3$. It is noted that the aforementioned doping concentration ranges are not limiting and other doping concentration ranges are within the spirit and the scope of this disclosure.

In some embodiments, a B-doped (p-type) SiGe S/D can be an epitaxial stack that can include two or more epitaxial layers (not shown in FIG. 10) grown in succession and can feature different germanium (Ge) atomic % and different B dopant concentrations. By way of example and not limitation, the first layer can have a Ge atomic % that ranges from 0 to about 40%, and a B dopant concentration that ranges from about $5\times10^{19}$ atoms/cm$^3$ to about $1\times10^{21}$ atoms/cm$^3$. The second epitaxial layer can have a Ge atomic % that ranges from about 20% to about 80%, and a B dopant concentration that ranges from about $3\times10^{21}$ atoms/cm$^3$ to about $5\times10^{21}$ atoms/cm$^3$. Finally, the third epitaxial layer can be a capping layer that can have similar Ge atomic % and B dopant concentrations as the first layer (e.g., 0 to about 40% for Ge, and about $5\times10^{19}$ atoms/cm$^3$ to about $1\times10^{21}$ atoms/cm$^3$ for B dopant). The thickness of these layers can vary depending on the device performance requirements. For example, the first epitaxial layer can have a thickness range from about 10 nm to about 20 nm, the second epitaxial layer can have a thickness range from about 30 nm to about 60 nm, and the third epitaxial layer (capping layer) can have a thickness range from 0 to about 10 nm. It is noted that the aforementioned thicknesses and doping concentrations are not limiting and other thickness and doping concentrations are within the spirit and the scope of this disclosure.

After the epitaxial stack formation, a protective nitride layer 1005 can be deposited over epitaxial stacks 1000, insulating layer 910 and spacers 915. In some embodiments, protective nitride layer 1005 can have a thickness that ranges from about 3 nm to about 5 nm. By way of example and not limitation, the protective nitride layer 1005 can be deposited by a conformal deposition process, such as atomic layer deposition (ALD), plasma-enhanced ALD (PEALD), chemical vapor deposition (CVD), plasma-enhanced CVD (PECVD), or any other appropriate deposition method. For example, protective nitride layer 1005 can be deposited with an ALD process at about 500° C. According to some embodiments, protective nitride layer 1005 can function as an etch stop layer (ESL) for a subsequent etch process during the formation of contact openings (not shown in FIG. 10) on S/D epitaxial stacks 1000.

In referring to FIG. 1 and FIG. 10, method 100 continues with operation 120 and the formation of an isolation layer 1010 over vertical structures 810 to surround sacrificial gate structure 900. According to some embodiments, isolation layer 1010 is an interlayer dielectric (ILD) that includes SiO$_2$, SiOC, SiON, silicon oxy-carbon nitride (SiOCN), or SiCN that can be deposited by CVD, physical vapor deposition (PVD), a thermally grown process, or any other appropriate deposition method. In some embodiments, the as-deposited isolation layer 1010 can be over sacrificial gate structures 900. A chemical mechanical polishing (CMP) process can polish down (e.g., remove and planarize) the isolation material from the top of sacrificial gate structures 900 so that the top surface of the isolation layer 1010 and the top surface of sacrificial gate structure 900 are substantially co-planar. According to some embodiments, FIG. 10 shows isolation layer 1010 after the aforementioned CMP process. It is noted that isolation layer 1010 can extend between adjacent sacrificial gate structures 900 and provide electrical isolation to the structural elements it surrounds—for example, sacrificial gate structure 900, S/D epitaxial stacks 1000, and the S/D metal contacts that will be formed adjacent to the gate structures. In some embodiments, an optional capping layer or hard mask layer (not shown in FIG. 10) can be grown on isolation layer 1010 to protect isolation layer 1010 from being etched during a gate replacement process (e.g., during the sacrificial gate dielectric 935 etch).

Figure 11:
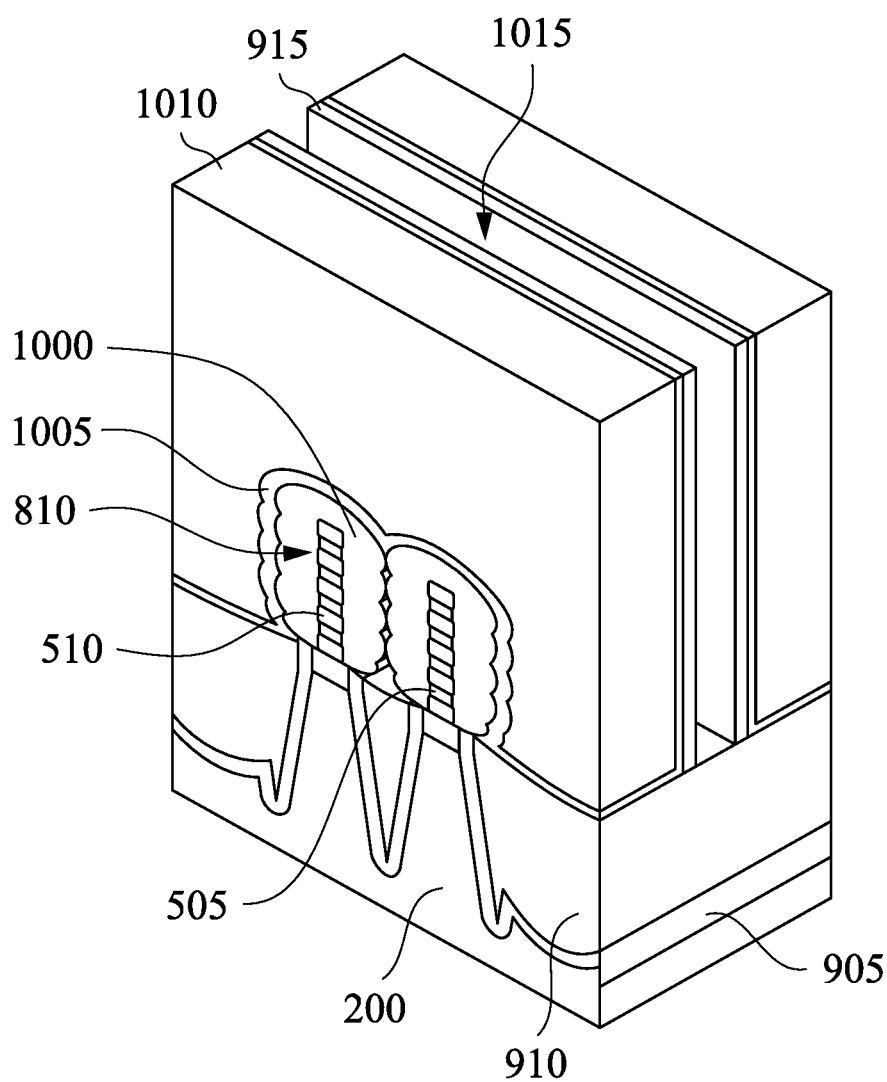

In operation 125 of FIG. 1, sacrificial gate structure 900 (shown in FIG. 10) can be removed to form an opening 1015 in isolation layer 1010 shown in FIG. 11. In some embodiments, operation 120 can include a dual wet etching process during which sacrificial gate electrode 930 and sacrificial gate dielectric 935 are removed sequentially. By way of example and not limitation, sacrificial gate structure 900 can be removed with a first wet etching process designed to be selective towards the polysilicon material of sacrificial gate electrode 930. For example, the selectivity of the first wet chemistry can be greater than about 1000:1 (e.g., 10000:1) so that gate spacers 915, sacrificial gate dielectric 935, and isolation layer 1010 are not removed by the first wet etching process. It is noted that since sacrificial gate dielectric 935 is interposed between vertical structures 810 and sacrificial gate electrode 930, sacrificial gate dielectric 935 can protect the SiGe/Si nano-sheet layers 505/510 of vertical structures 810 from being etched during the first wet etching process. Further referring to FIG. 11, a subsequent second wet etching process can remove sacrificial gate dielectric 935 without etching gate spacers 915, isolation layer 1010, and the vertical structure 810. By way of example and not limitation, the second wet etching chemistry can be respectively selective towards sacrificial gate dielectric 935 so that surrounding materials, such as gate spacers 915 and first, second nano-sheet layers of the multilayer nano-sheet stack, and isolation layer 1010 are not removed. In the event that the second etching chemistry can etch isolation layer 1010, a capping layer or hard mask can be formed over isolation layer 1010 after operation 120, as discussed earlier, to protect isolation layer 1010 from the second wet etching process. In some embodiments, after operation 125 and the removal of sacrificial gate structure 900, the SiGe and Si nano-sheet layers of vertical structures 810 are exposed inside opening 1015, while the SiGe and Si nano-sheet layers of vertical structures 810 outside opening 1015 are covered by S/D epitaxial stacks 1000, protective nitride layer 1005 and isolation layer 1010.

In operation 130 of method 100, SiGe nano-sheet layers 505 can be removed from opening 1015 so that n-type NSF can be formed thereon. In some embodiments, if the S/D epitaxial stacks 1000 are B-doped SiGe stacks (e.g., instead of P-doped Si layers), the Si nano-sheet layers can be removed from opening 1015, instead of the SiGe nano-sheet layers 505 to form p-type NSF. In other words, in operation 130, either the Si or the SiGe nano-sheet layers can be removed from opening 1015 assuming that the appropriate type of S/D epitaxial stack 1000 (e.g., SiGe or P-doped Si) has been grown on vertical structures 810. Further, in some locations on substrate 200, Si nano-sheet layers 510 can be removed to form n-type NSF, while in other locations on substrate 200, SiGe nano-sheet layers 505 can be removed to form p-type NSF. By way of example and not limitation, n-type and p-type NSF can be formed sequentially. For example, vertical structures 810 intended for p-type NSF can be covered with a hard mask, a photoresist, or sacrificial gate structure 900 while SiGe nano-sheet layers are removed from vertical structures 810 intended for n-type NSF.

For example purposes, operation 130 will be described with SiGe nano-sheet layers 505 being removed from vertical structures 810 to form n-type NSF. Based on the disclosure herein, Si nano-sheet layers 510, as discussed above, can be alternatively removed to form p-type NSF. Therefore, removal of Si nano-sheet layers 510 from opening 1015 is within the spirit and scope of this disclosure.

By way of example and not limitation, the removal of SiGe nano-sheet layers 505 from opening 1015 can be achieved with the use of a dry etching process that is selective towards SiGe. For example, halogen-based chemistries can exhibit etch selectivity that is high for Ge and low for Si. Therefore, halogen gases can etch Ge faster than Si.

Further, halogen gases can etch SiGe faster than Si. In some embodiments, the halogen-based chemistries include fluorine-based and/or chlorine-based gasses. Alternatively, a wet etch chemistry with high selectivity towards SiGe may be used. By way of example and not limitation, a wet etch chemistry may include a mixture of sulfuric acid ($H_2SO_4$) and hydrogen peroxide ($H_2O_2$) (SPM), or a mixture of ammonia hydroxide with $H_2O_2$ and water (APM). As a result of operation 130, Si nano-sheet layers 510 are suspended and separated in opening 1015 between spacers 915.

Since the dry or wet etching process of operation 130 is designed not to etch the Si nano-sheet layers 510 of vertical structures 810 (and therefore any Si material in general), fins 805 (shown in FIG. 8), which may have been formed in other locations of substrate 200, are not affected by the dry or wet etching process of operation 130.

Figure 12:
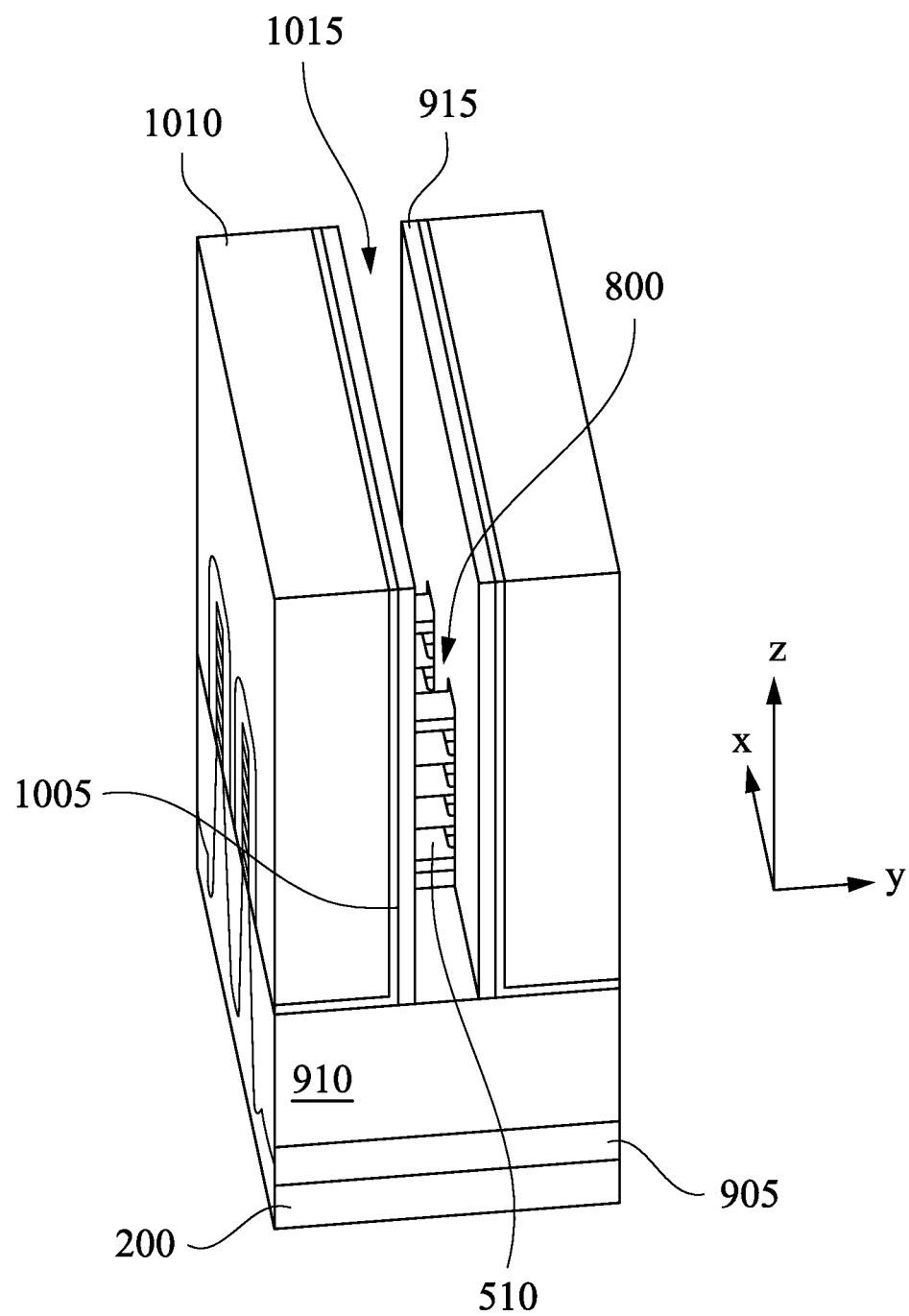

In some embodiments, a metal gate structure can be formed in opening 1015 over the exposed Si nano-sheet layers 510 shown in FIG. 12. FIG. 12 is an isometric view of the structure shown in FIG. 11 rotated by 45° around the z-axis. For example, referring to FIG. 13, metal gate structure 1400 which includes (i) an interfacial layer (not shown in FIG. 13), (ii) a high-k dielectric (e.g., with a k-value greater than 3.9) 1305, and (iii) a metal gate electrode stack 1310 is formed in opening 1015 of FIG. 12. For illustration purposes, FIG. 13 includes selected portions of a semiconductor structure and other portions (not shown) may be included. For example, the interfacial layer, and the one or more layers of metal gate electrode stack 1310 may be included.

In some embodiments, high-k dielectric 1305 can be hafnium oxide ($HfO_2$), a hafnium silicate-based material, or another suitable dielectric with a k-value greater than 3.9—which is the dielectric constant of stoichiometric $SiO_2$ and is used as a reference. Further, gate electrode stack 1310 may include a capping layer over the gate dielectric, one or more metallic layers, a workfunction metal (WFM) stack, and a metal fill layer. The number and type of metallic layers in the gate electrode stack can depend on the finFET's threshold voltage requirements. Exemplary metallic layers in the gate electrode stack can include a tantalum nitride (TaN) bottom layer and one or more titanium nitride (TiN) layers. In some embodiments, the WFM stack can include titanium/aluminum (Ti/Al) bi-layers or a titanium-aluminum (Ti—Al) alloy. The WFM stack can fine-tune the workfunction of metal gate electrode stack 1310 and influence the threshold voltage of the resulting finFET. The thickness and the number of the one or more TiN layers, in combination with the WFM stack, can set the finFET's threshold voltage. In some embodiments, metal fill layer can include a TiN barrier layer and a tungsten (W) metal stack. High-k dielectric 1305 and gate electrode stack 1310 are not limited to the material combinations described above. Therefore, additional materials can be used and are within the spirit and the scope of this disclosure.

According to some embodiments, an interfacial layer is an oxide formed naturally during the deposition of high-k dielectric 1305. Interfacial layer and high-k dielectric 1305 are formed directly on the exposed surfaces of second Si nano-sheet layers 510 within opening 1015 (shown in FIG. 12). Metal gate electrode stack 1310 can be subsequently deposited over high-k dielectric 1305 in opening 1015 to complete the formation of the n-type nano-sheet FET or nano-sheet NFET. FIG. 14 is a cross-sectional view of vertical structure 810 between gate spacers 915, along line 1315 of FIG. 13. According to some embodiments, FIG. 14 is a cross sectional view of a GAA nano-sheet NFET structure with multiple Si nano-sheet layers surrounded by at least high-k dielectric 1305 and metal gate electrode stack 1310. When the GAA nano-sheet NFET is turned on, current flows in the <110> direction (e.g., along the y-axis) and parallel to the (100) crystal plane (e.g., x-y plane), as discussed earlier.

Figure 14:
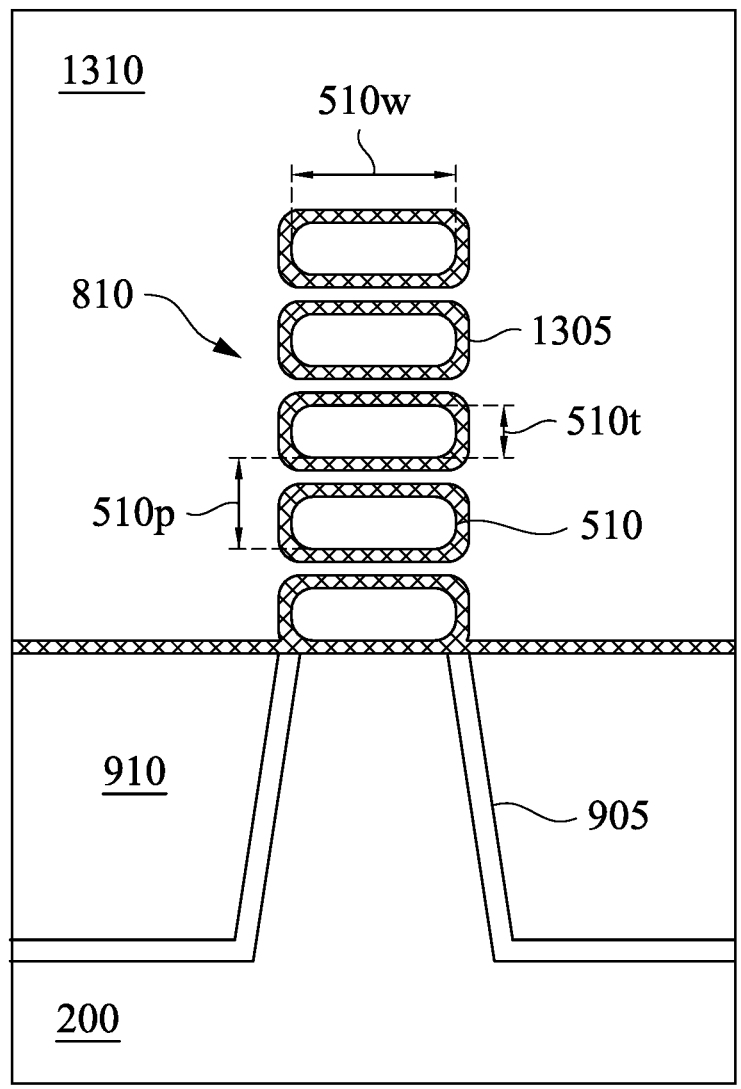
FIG. 14 is a cross-sectional view of a gate-all-around nano-sheet FET, in accordance with some embodiments.
Figure 15:
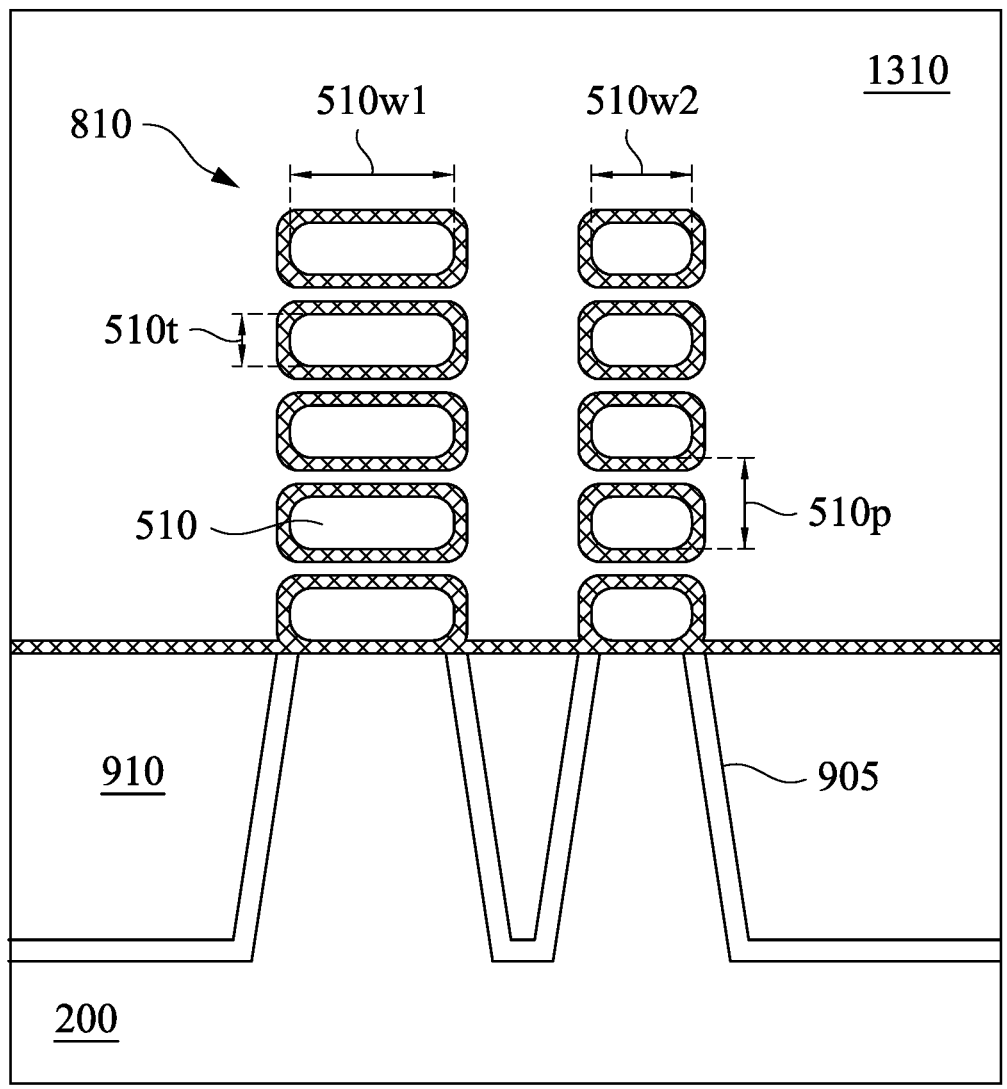
FIG. 15 is a cross-sectional view of two gate-all-around nano-sheet FETs with different nano-sheet layer widths, in accordance with some embodiments.

In FIG. 14, Si nano-sheet layers 510 in vertical structures 810 are shown to have a thickness 510$t$ and width 510$w$, which is substantially equal to width 810$w$ of vertical structures 810 shown in FIG. 8. As discussed earlier, width 810$w$ of Si nano-sheet layers 510 can be controlled by width 700$w$ of patterned photoresist structures 700, as shown in FIG. 7. By adjusting width 700$w$ of patterned photoresist structures 700, width 510$w$ of Si nano-sheet layers 510 can be modulated. Consequently, multilayer vertical structures with different widths can be formed across substrate 200. For example, according to some embodiments, vertical structures 810 with different widths, 510$w$1 and 510$w$2, can be formed on substrate 200 as shown in FIG. 15. In the example of FIG. 15, 510$w$1 is greater than 510$w$2. As discussed earlier, the nano-sheet FETs, which are built on vertical structures 810 and feature nano-sheet layers (Si or SiGe) with differed widths 510$w$1 and 510$w$2, can have different drive current capabilities and DIBL behavior. It is therefore possible to individually tune the nano-sheet FETs in desired areas of the substrate by controlling the width of their nano-sheet layers, according to some embodiments.

Figure 6:
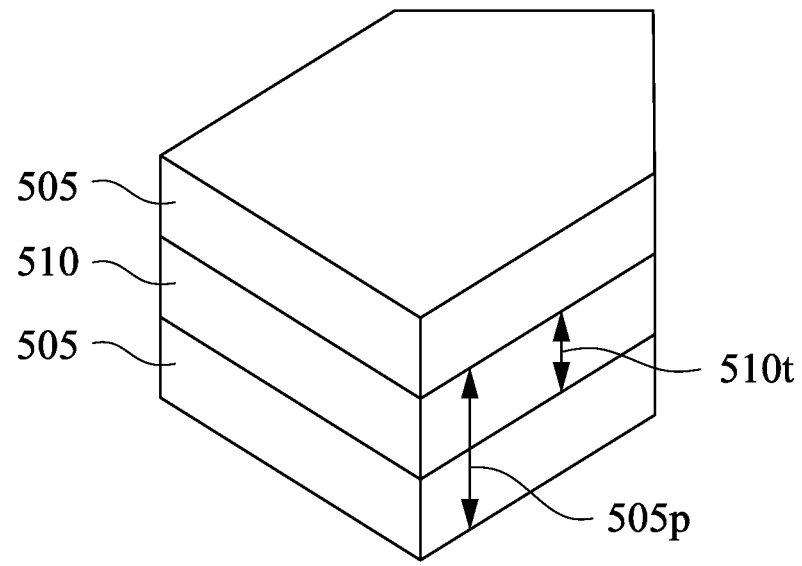
Figure 6:
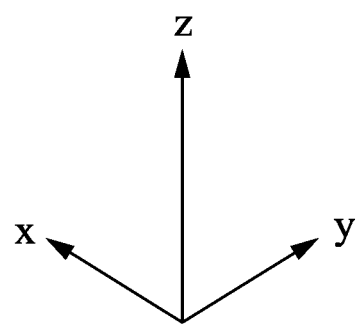

Further, and in referring to FIGS. 14 and 15, thickness 510$t$ of Si nano-sheet layers 510 can be controlled during the growth of the Si nano-sheet layers, as discussed in FIG. 6. Additionally, and in referring to FIGS. 14 and 15, pitch 510$p$ of Si nano-sheet layers 510 can be controlled by the thickness of SiGe nano-sheet layers 505, as discussed in FIG. 6.

Based on the above, vertical structures 810 with Si nano-sheet layers 510 having different dimensions can be formed across substrate 200. Similarly, vertical structures 810 with SiGe nano-sheet layers 505 having different dimensions can be formed across substrate 200, according to some embodiments.

Figure 16:
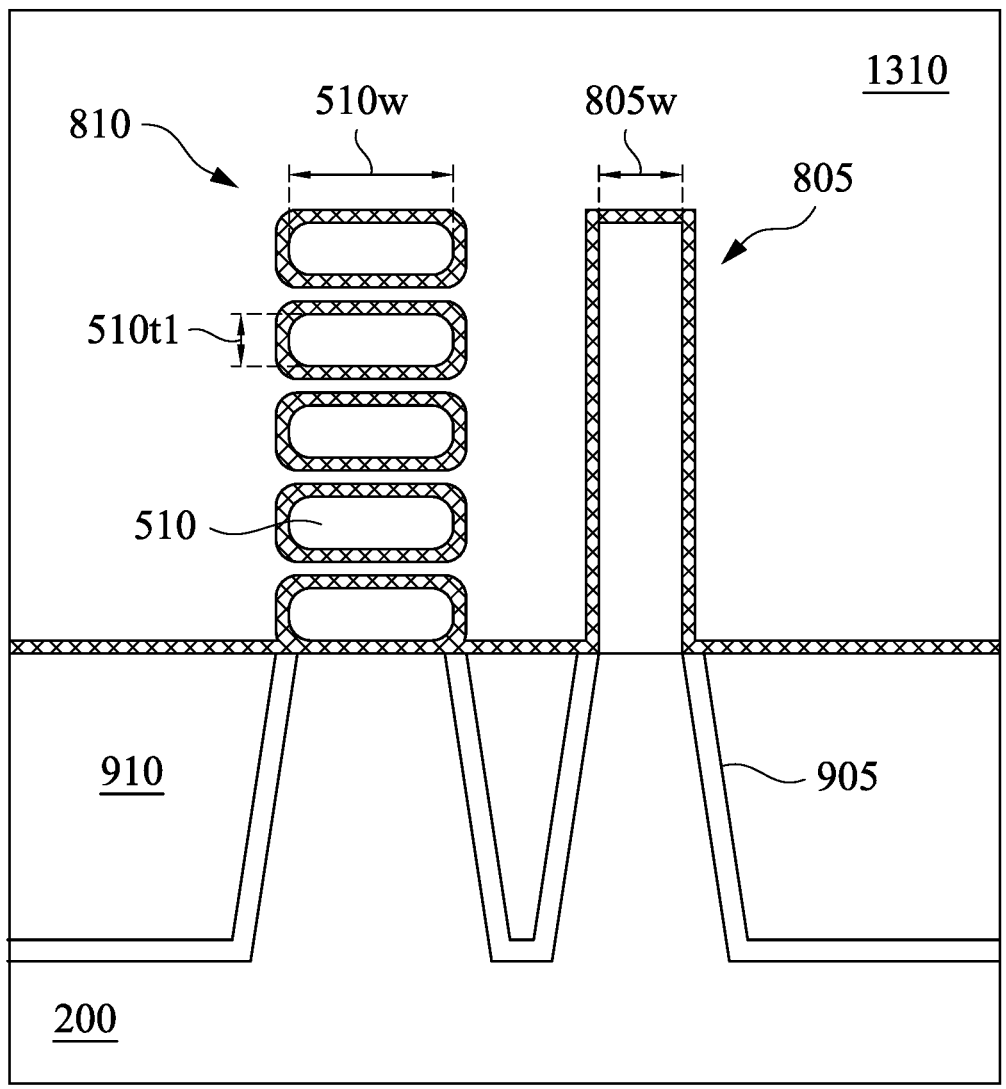
FIG. 16 is a cross-sectional view of hybrid structure with a gate-all-around nano-sheet FET and a finFET, in accordance with some embodiments.

According to some embodiments, FIG. 16 shows a hybrid structure, where fin 805 is formed adjacent to a vertical structure 810. Accordingly, gate electrode stack 1310 can be shared between the structures forming a nano-sheet GAA NFET on vertical structure 810 and an n-type finFET on fin 805. As discussed earlier, width 510$w$ of Si nano-sheet layers 510 can be greater than width 805$w$ of fin 805. According to some embodiments, the nano-sheet GAA NFET formed on vertical structure 810 has improved gate control over its channel region compared to the n-type finFET formed on fin 805. Similarly, GAA nano-sheet NFETs and PFETs can be formed adjacent to p-type and n-type finFETs. Further, certain areas of substrate 200 can be configured to have exclusively nano-sheet GAA NFETs or PFETs, p-type and n-type finFETs, or combinations thereof.

Figure 13:
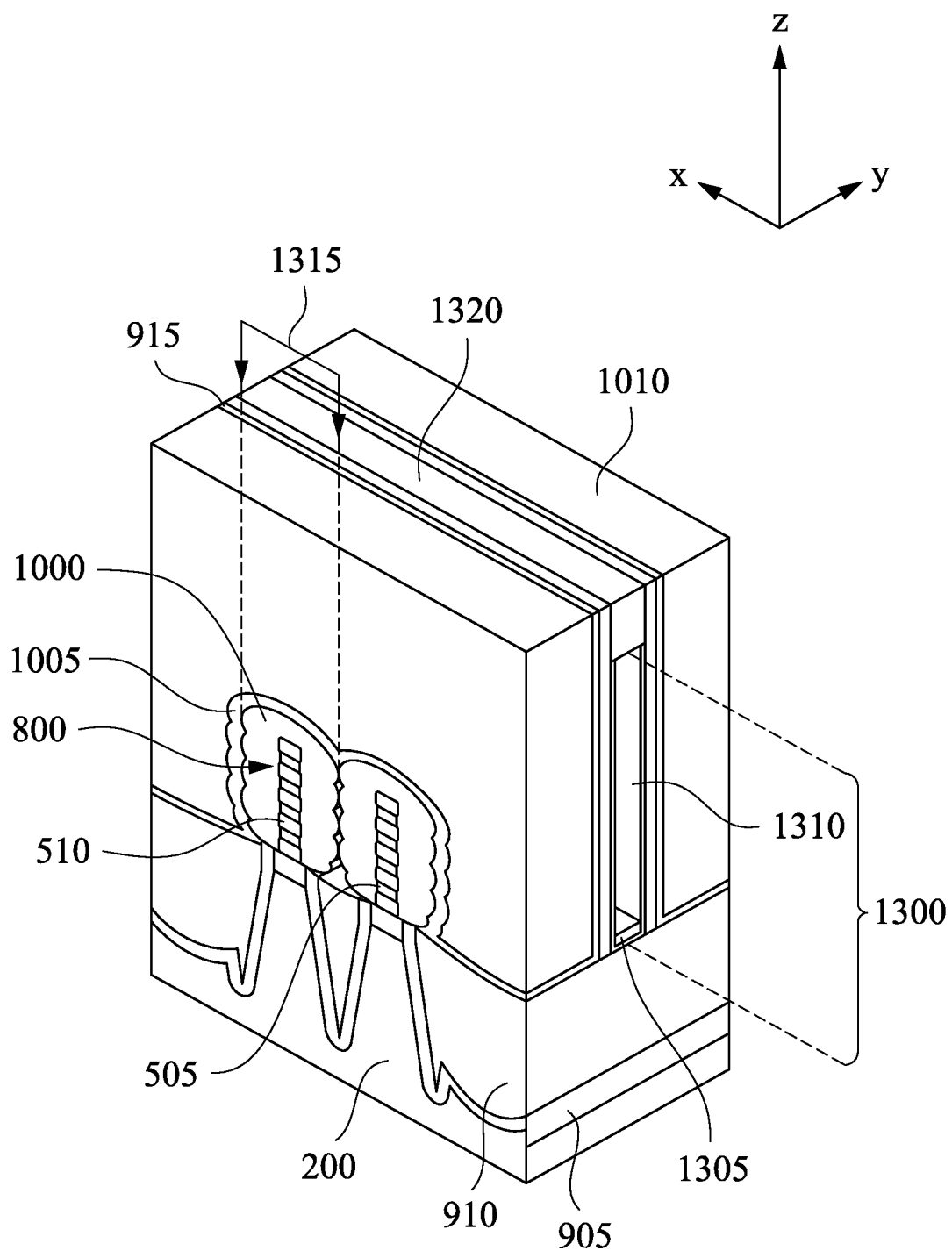

In referring to FIG. 13, a nitride capping layer 1320 can be formed over metal gate electrode stack 1310. In some embodiments, a source/drain contact formation follows, where contacts are formed on S/D epitaxial stacks 1000 (not shown in FIG. 13) running vertically through isolation layer 1010.

Method 100 of FIG. 1 may also include an optional operation 140, where a portion of metal gate electrode stack 1310 of metal gate structure 1300 is removed or recessed to remove up to half of the Si nano-sheet layers 510 of vertical structures 810. By way of example and not limitation, one to three Si nano-sheet layers 510 can be removed during optional operation 140 to form a nano-sheet NFET featuring six Si nano-sheet layers. According to some embodiments, removing (e.g., "cutting") a portion of gate electrode stack 1310 and a corresponding number of Si nano-sheet layers 510 can reduce the power consumption of the GAA nano-sheet NFET. Optional operation 140 can be performed selectively on one or more GAA nano-sheet NFETs across substrate 200 to modulate the drive current and power consumption of the GAA nano-sheet NFETs. Accordingly, operation 140 can be applied to GAA nano-sheet PFETs, according to some embodiments.

Figure 17:
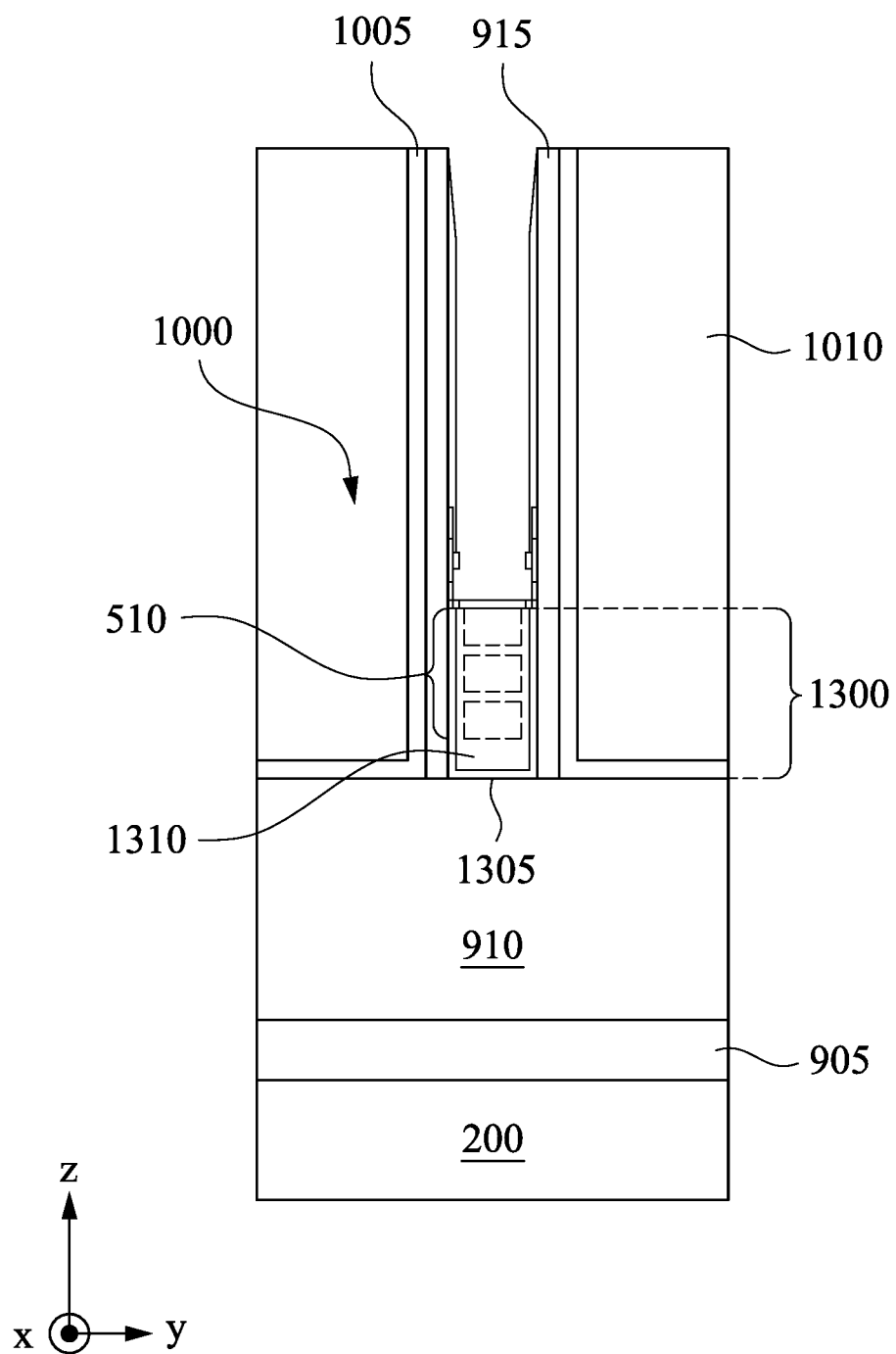
FIG. 17 is an isometric view of a gate-all-around nano-sheet FET with reduced number of nano-sheet layers, in accordance with some embodiments.

By way of example and not limitation, FIG. 17 is cross sectional view of FIG. 13 along the y-z plane after optional operation 140 of method 100. As discussed above, a portion of metal gate structure 1300 has been removed or recessed so that up to half of Si nano-sheet layers 510 are removed from the top of the vertical structure. In some embodiments, substrate 200 may feature multiple GAA NSF with modified gate electrode structures 1300. After the optional operation 140, a nitride layer (e.g., similar to nitride layer 1320) can be grown over the modified metal gate structure 1300, not shown in FIG. 17.

Figure 18:
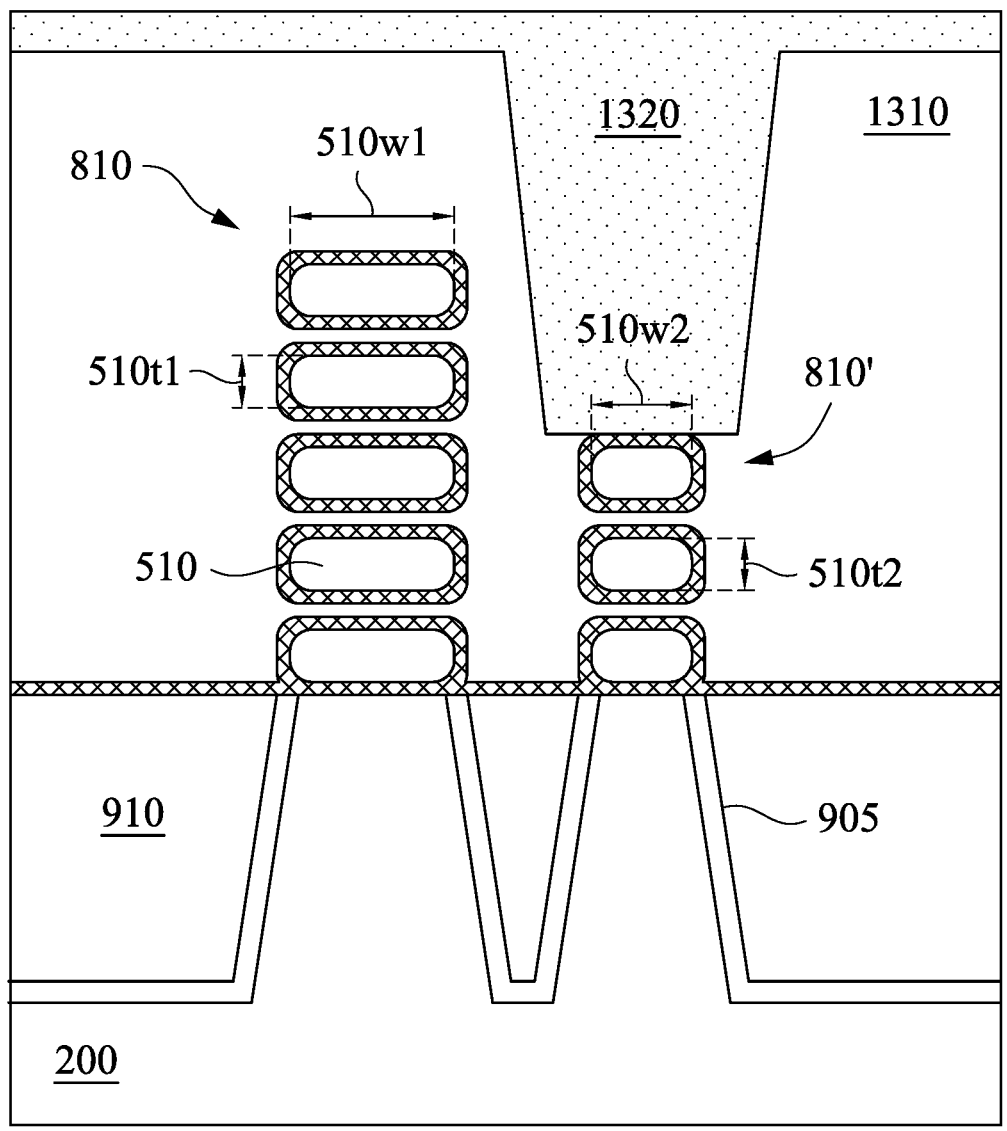
FIG. 18 is a cross-sectional view of two gate-all-around nano-sheet FETs with a different number of nano-sheet layers, in accordance with some embodiments.

FIG. 18 is a cross-sectional view of a structure according to another embodiment of this disclosure, where a cross section of two GAA nano-sheet NFETs is shown on different vertical structures 810 and 810'. Vertical structures 810 and 810' have different respective Si nano-sheet layer widths (e.g., $510w1$ and $510w2$), and different number of Si nano-sheet layers 510 as a result of operation 140. In the example of FIG. 18, $510w1$ is wider than $510w2$. However this is not limiting and $510w1$ can have a width equal to, or narrower than, $510w2$. Further, the thickness of the Si nano-sheet layers $510t1$ and $510t2$ can be equal or different. For example, $510t1 \geq 510t2$ or $510t1 \leq 510t2$. In some embodiments, the GAA nano-sheet NFET on vertical structure 810' can be a low-power NSF with lower drive current capability than the GAA nano-sheet NFET on vertical structure 810. Further, 810 and 810' can be located on the same or different areas of substrate 200. For example, vertical structures 810 and 810' may not be located next to each other.

In some embodiments, operation 140 of method 100 is performed after the replacement of sacrificial gate structure 900 and prior to the formation of the S/D contacts on S/D epitaxial stacks 1000.

The embodiments described herein are directed to a method that describes the formation of GAA nano-sheet NFETs and PFETs with tunable performance (e.g., tunable drive current and power consumption). In some embodiments, the channel region of a tunable n-type and/or p-type NSF can be formed from vertical structures that feature alternating pairs of first and second nano-sheet layers stacked on top of each other. By way of example and not limitation, the GAA nano-sheet NFET can include Si nano-sheet layers and the nano-sheet GAA PFETs can include SiGe nano-sheet layers. In some embodiments, the number, the width, the thickness, and the pitch of the nano-sheet layers in each GAA NSF can be controlled during the early stages of the fabrication process and can be used to tailor the electrical characteristics and performance of the resulting GAA NSF. Due to selective processing, hybrid structures with finFETs and GAA NSF can be concurrently formed on the same substrate. Further, GAA NSF with different nano-sheet widths, number, thicknesses, and electrical characteristics can be formed on the same substrate according to some embodiments. The resulting GAA nano-sheet FETs can exhibit improved DIBL behavior compared to finFETs.

In some embodiments, a semiconductor structure includes a fin and a vertical structure over a substrate. Further, the vertical structure includes a first portion with alternating first and second nano-sheet layers and a second portion with the second nano-sheet layers, where the second nano-sheet layers from the first portion extend through the second portion. The semiconductor structure further includes a gate structure over a portion of the fin and over the second portion of the first vertical structure, where the gate structure surrounds the second nano-sheet layers of the second portion of the first vertical structure and a top and a side portion of the fin.

In some embodiments, a semiconductor structure includes a vertical structure over a substrate, where the vertical structure includes a first portion with alternating first and second nano-sheet layers and a second portion without the first nano-sheet layers and with a different number of second nano-sheet layers from the first portion. The semiconductor structure also includes a fin over the substrate; a first gate structure that is surrounding the top, bottom, and side surfaces of each of the second nano-sheet layers of the second portion of the vertical structure; and a second gate structure surrounding a portion of the fin, where the second gate structure is taller than the first gate structure.

In some embodiments, a method includes disposing a first and a second vertical structure over a substrate, where the first and second vertical structures are separated by a first dielectric. Further, each of the first and the second vertical structures have different widths and a top portion, above the first isolation layer, comprising a multilayer nano-sheet stack with alternating first and second nano-sheet layers. The method also includes disposing a sacrificial gate structure over the top portion of the first and second vertical structures and over a portion of the first isolation layer; depositing a second isolation layer over the first and second vertical structures and the first isolation layer so that the second isolation layer surrounds a sidewall of the sacrificial gate structure; etching the sacrificial gate structure to expose each multilayer nano-sheet stack from the first and second vertical structures; removing the first nano-sheet layers from each exposed multilayer nano-sheet stack to form suspended second nano-sheet layers; and forming a metal gate structure to surround the suspended second nano-sheet layers.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a fin over a substrate;
   a first vertical structure over the substrate, wherein the first vertical structure comprises:

a first portion with alternating first and second nano-sheet layers; and a second portion with the second nano-sheet layers, wherein the second nano-sheet layers from the first portion extend through the second portion; and a gate structure over a portion of the fin and over the second portion of the first vertical structure, wherein the gate structure surrounds the second nano-sheet layers of the second portion of the first vertical structure and a top and a side portion of the fin, wherein a height of the gate structure over the portion of the fin is different from a height of the gate structure over the second portion of the first vertical structure, wherein a first portion of the gate structure adjacent the fin has a first bottom surface level with a second bottom surface of a second portion of the gate structure adjacent the first vertical structure.

2. The semiconductor structure of claim 1, further comprising:

a source/drain epitaxial stack on the first portion of the first vertical structure and adjacent the gate structure; and another source/drain epitaxial stack on the fin and adjacent to the gate structure.

3. The semiconductor structure of claim 1, wherein a width of the first vertical structure is equal to or wider than a width of the fin.

4. The semiconductor structure of claim 3, wherein the width of the first vertical structure is equal to a width of the second nano-sheet layers and ranges from about 4 nm to about 50 nm.

5. The semiconductor structure of claim 4, further comprising:

another vertical structure over the substrate, wherein the another vertical structure comprises:

a first portion with the alternating first and second nano-sheet layers; and a second portion with the second nano-sheet layers of the another vertical structure, wherein a width of second nano-sheet layers of the another vertical structure is different from the width of the second nano-sheet layers of the first vertical structure.

6. The semiconductor structure of claim 1, wherein a pitch of the first nano-sheet layers is based on a thickness of the second nano-sheet layers, and wherein a pitch of the second nano-sheet layers is based on a thickness of the first nano-sheet layers.

7. The semiconductor structure of claim 1, wherein the first nano-sheet layers comprise silicon-germanium and the second nano-sheet layers comprise silicon.

8. The semiconductor structure of claim 1, wherein the first nano-sheet layers comprise silicon and the second nano-sheet layers comprise silicon-germanium.

9. The semiconductor structure of claim 1, wherein the first and second nano-sheet layers comprise different epitaxially grown materials.

10. The semiconductor structure of claim 1, wherein a top surface of the first and second nano-sheet layers are parallel to a (100) crystal plane.

11. A semiconductor structure comprising:

a first vertical structure over a substrate, wherein the first vertical structure comprises:

a first portion with alternating first and second nano-sheet layers; and a second portion without the first nano-sheet layers and with a different number of second nano-sheet layers from the first portion;

a fin over the substrate;

a first gate structure surrounding top, bottom, and side surfaces of each of the second nano-sheet layers of the second portion of the first vertical structure; and a second gate structure surrounding a portion of the fin, wherein the second gate structure is taller than the first gate structure, wherein a lower surface of the first gate structure is level with a lower surface of the second gate structure.

12. The semiconductor structure of claim 11, further comprising:

a source/drain epitaxial stack on the first portion of the first vertical structure and adjacent to the first gate structure; and another source/drain epitaxial stack on the fin and adjacent to the second gate structure.

13. The semiconductor structure of claim 11, further comprising:

another vertical structure over the substrate, wherein the another vertical structure comprises:

a first portion with the alternating first and second nano-sheet layers; and a second portion without the first nano-sheet layers and with an equal number of second nano-sheet layers as the first portion; and a third gate structure surrounding each of the second nano-sheet layers of the second portion of the another vertical structure, wherein the third gate structure is taller than the first gate structure.

14. The semiconductor structure of claim 13, wherein a width of the another vertical structure is equal to a width of the first vertical structure.

15. The semiconductor structure of claim 13, wherein a width of the another vertical structure is different from a width of the first vertical structure.

16. The semiconductor structure of claim 13, wherein the second portion of the first vertical structure has fewer second nano-sheet layers than the second portion of the another vertical structure.

17. The semiconductor structure of claim 11, wherein the first nano-sheet layers comprise silicon and the second nano-sheet layers comprise silicon-germanium.

18. The semiconductor structure of claim 11, wherein each of the first and second nano-sheet layers have a thickness that ranges from about 5 nm to about 20 nm.

19. A semiconductor structure comprising:

a vertical structure over a substrate, wherein the vertical structure comprises:

a channel region having a plurality of first nano-structure layers; and a source/drain region, wherein at least some of the plurality of first nano-structures layers extends into the source/drain region;

a fin over the substrate;

a first gate structure surrounding top, bottom, and side surfaces of each of the plurality of first nano-structure layers of the channel region of the vertical structure; and a second gate structure surrounding a portion of the fin, wherein a height of the second gate structure is different from a height of the first gate structure, wherein a bottom of the first gate structure is level with a bottom of the second gate structure.

20. The semiconductor structure of claim 19, wherein the source/drain region comprises a different number of the plurality of first nano-structure layers than the channel region.

* * * * *